US010295625B2

(12) United States Patent
Okamoto

(10) Patent No.: US 10,295,625 B2
(45) Date of Patent: May 21, 2019

(54) MAGNETIC RESONANCE IMAGING APPARATUS

(71) Applicant: TOSHIBA MEDICAL SYSTEMS CORPORATION, Otawara-Shi (JP)

(72) Inventor: Kazuya Okamoto, Saitama (JP)

(73) Assignee: Toshiba Medical Systems Corporation, Otawara-shi (JP)

(*) Notice: Subject to any disclaimer, the term of this patent is extended or adjusted under 35 U.S.C. 154(b) by 559 days.

(21) Appl. No.: 14/948,794

(22) Filed: Nov. 23, 2015

(65) Prior Publication Data

US 2016/0154074 A1 Jun. 2, 2016

(30) Foreign Application Priority Data

Nov. 27, 2014 (JP) .................. 2014-239614

(51) Int. Cl.
*G01V 3/00* (2006.01)
*G01R 33/36* (2006.01)
(Continued)

(52) U.S. Cl.
CPC ..... *G01R 33/3664* (2013.01); *G01R 33/3692* (2013.01); *G01R 33/5659* (2013.01); *G01R 33/3415* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/54; G01R 33/543; G01R 33/561; G01R 33/563; G01R 33/565;
(Continued)

(56) References Cited

U.S. PATENT DOCUMENTS 9,517,021 B2 * 12/2016 Anderson ............ A61B 5/0002
2008/0246477 A1 * 10/2008 Nakabayashi ... G01R 33/34046
324/312
(Continued)

FOREIGN PATENT DOCUMENTS

JP 63-161947 A 7/1988
JP 2003-38458 A 2/2003
(Continued)

OTHER PUBLICATIONS

Office Action dated Jul. 31, 2018 in Japanese Patent Application No. 2014-239614.

*Primary Examiner* — Thang X Le
(74) *Attorney, Agent, or Firm* — Oblon, McClelland, Maier & Neustadt, L.L.P.

(57) ABSTRACT

In one embodiment, an MRI apparatus, which is wirelessly connected to a wireless RF coil equipped with a plurality of coil elements, includes memory circuitry configured to store at least one program and processing circuitry configured, by executing the at least one program, to (a) set an imaging region of an object, (b) identify a position of each of the plurality of coil elements included in the wireless RF coil based on a signal obtained by radio communication with the wireless RF coil, and (c) select at least one of the plurality of coil elements with respect to three axes, based on positional relationship between the imaging region and the position of each of the plurality of coil elements.

7 Claims, 12 Drawing Sheets

(51) Int. Cl.
*G01R 33/565* (2006.01)
*G01R 33/3415* (2006.01)

(58) Field of Classification Search
CPC ............ G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341; G01R 33/385; G01R 33/4828; G01R 33/56358; A61B 5/055; A61B 5/0555; A61B 5/7278; A61B 5/725
See application file for complete search history.

(56) References Cited

U.S. PATENT DOCUMENTS

2010/0176809 A1* 7/2010 Biber ................. G01R 33/3692 324/309
2012/0319689 A1* 12/2012 Ichinose ............ G01R 33/3664 324/322
2014/0145717 A1* 5/2014 Ozawa ............... G01R 33/3664 324/307
2014/0300355 A1* 10/2014 Fautz ..................... G01R 33/28 324/309

FOREIGN PATENT DOCUMENTS

| JP | 2003-135420 | 5/2003 |
| JP | 2006-528509 A | 12/2006 |
| JP | 2008-508924 A | 3/2008 |
| JP | 2010-259777 | 11/2010 |
| JP | 2011-36452 A | 2/2011 |
| JP | 2011-78841 A | 4/2011 |
| JP | 2012-061306 | 3/2012 |
| JP | 2014-46094 A | 3/2014 |

* cited by examiner

| IMAGING REGION | TYPE OF PULSE SEQUENCE | WIRELESS RF COIL USED FOR RECEIVING MR SIGNALS | APPROPRIATE SELECTION NUMBER OF COIL ELEMENTS |
|---|---|---|---|
| CEREBRUM 20cm × 20cm | FAST SPIN ECHO | HEAD PART RF COIL | 5 |
| CEREBRUM 20cm × 20cm | ECHO PLANAR IMAGING | HEAD PART RF COIL | 3 |
| HEART 15cm × 20cm | FAST SPIN ECHO | CHEST PART RF COIL | 8 |
| HEART 15cm × 20cm | ECHO PLANAR IMAGING | CHEST PART RF COIL | 4 |
| RIGHT LUNG 20cm × 25cm | FAST SPIN ECHO | CHEST PART RF COIL | 8 |
| RIGHT LUNG 20cm × 25cm | ECHO PLANAR IMAGING | CHEST PART RF COIL | 4 |
| ALL THE ORGANS 50cm × 40cm | FAST SPIN ECHO | CHEST PART RF COIL AND PELVIC PART RF COIL | 14 |
| ALL THE ORGANS 50cm × 40cm | ECHO PLANAR IMAGING | CHEST PART RF COIL AND PELVIC PART RF COIL | 8 |
| RIGHT KNEE 20cm × 20cm | FAST SPIN ECHO | KNEE PART RF COIL | 3 |

FIG. 6

SENSITIVITY CORRECTION COEFFICIENT
FOR CHEST PART RF COIL 100

| COIL ELEMENT | DISTANCE DD (cm) | SENSITIVITY CORRECTION COEFFICIENT |
|---|---|---|
| 106a | DD≦10 | 1 |
| 106a | 10<DD≦15 | 0.95 |
| 106a | 15<DD≦20 | 0.9 |
| 106a | 20<DD≦25 | 0.8 |
| 106a | 30<DD≦35 | 0.7 |
| 106a | 35<DD≦40 | 0.6 |
| 106a | 40<DD | 0.5 |
| 106b | DD≦10 | 1 |
| 106h | DD≦10 | 1 |
| 106h | 10<DD≦15 | 0.98 |
| 106h | 15<DD≦20 | 0.95 |
| 106h | 20<DD≦25 | 0.92 |
| 106h | 30<DD≦35 | 0.88 |
| 106h | 35<DD≦40 | 0.84 |
| 106h | 40<DD | 0.8 |

FIG. 8

MAGNETIC RESONANCE IMAGING APPARATUS

CROSS-REFERENCE TO RELATED APPLICATIONS

This application is based upon and claims the benefit of priority from Japanese Patent Application No. 2014-239614 filed on Nov. 27, 2014, the entire contents of which are incorporated herein by reference.

FIELD

Embodiments described herein relate generally to magnetic resonance imaging apparatus.

BACKGROUND

MRI is an imaging method which magnetically excites nuclear spin of an object placed in a static magnetic field with an RF pulse having the Larmor frequency and reconstructs an image based on MR signals generated due to the excitation. The above-described MRI means magnetic resonance imaging, the RF pulse means a radio frequency pulse, and the MR signal means a nuclear magnetic resonance signal.

Here, an RF (Radio Frequency) coil is a coil device which applies an RF pulse to nuclear spin inside an object by, for example, supplying a coil with an RF pulse electric current and receives generated echo signals as MR signals.

RF coils are classified into the following three types in terms of transmission and reception: a transmit-only RF coil, a receive-only RF coil, and a dual-purpose RF coil used for application of RF pulses and reception of MR signals. In addition, RF coils are also classified into a whole body type and a local type.

Since MR signals emitted from an object are weak, it is preferable to receive MR signals at a position as close to the object as possible. Thus, various types of the local RF coils, each of which is shaped so as to fit each part of a human body, are used depending on an imaging part.

In MRI, multi-channel structure has been developed in an acquisition system of MR signals. The above-described channel means each of pathways of MR signals outputted from each of coil elements and inputted to an RF receiver of an MRI apparatus. The number of channels is set to equal to or smaller than the input reception number of the RF receiver.

If the number of cables between an RF coil and a control side of an MRI apparatus such as an RF receiver side increases due to development of the above-described multichannel structure, it is inconvenient because hard-wiring becomes complicated. Thus, wireless RF coils which unwire transmission and reception of data between an RF coil and a control side of an MRI apparatus are developed.

A significant number of coil elements are included in a wireless RF coil attached to an object. In addition, when plural wireless RF coils are attached to an object, the number of coil elements further increases.

BRIEF DESCRIPTION OF THE DRAWINGS

In the accompanying drawings:

FIG. 6 is a chart showing an example of appropriate selection number of coil elements determined based on a combination of RF coils, type of pulse sequence, and an imaging region;

FIG. 8 is a chart showing an example of table data of sensitivity correction coefficients, by which receiving sensitivity of each of coil elements is corrected according to the distance from the center of the imaging region;

DETAILED DESCRIPTION

In one embodiment, an MRI apparatus, which is wirelessly connected to a wireless RF coil equipped with a plurality of coil elements, includes memory circuitry configured to store at least one program and processing circuitry configured, by executing the at least one program, to (a) set an imaging region of an object, (b) identify a position of each of the plurality of coil elements included in the wireless RF coil based on a signal obtained by radio communication with the wireless RF coil, and (c) select at least one of the plurality of coil elements with respect to three axes, based on positional relationship between the imaging region and the position of each of the plurality of coil elements.

First Embodiment

In the first embodiment, each of control side radio communication devices 36A, 36B, and 36C (FIG. 1) disposed at respective three positions of an MRI apparatus 10A wirelessly transmits an scanning signal and a positional signal response circuit 124a (FIG. 4) of a wireless RF coil 100 wirelessly transmits three response signals corresponding to the respective three scanning signals.

The response time to the scanning signal is calculated for each of the control side radio communication devices 36A, 36B, and 36C, then the distance between the RF coil 100 and each of the control side radio communication devices 36A, 36B, and 36C is calculated based on each response time, and thereby the position of the RF coil 100 is identified. The position of each of coil elements inside the RF coil 100 is determined based on (a) the position of the RF coil 100 identified in the above manner and (b) arrangement data of respective coil elements inside the RF coil 100 corresponding to the identification information of the RF coil 100.

Moreover, the control side of the MRI apparatus 10A determines appropriate selection number of coil elements based on type of each RF coil, imaging regions, type of pulse sequence. This appropriate selection number is determined in such a manner that the rate of wirelessly transmitting data of MR signals from each RF coil to the RF receiver side of the MRI apparatus follows the progression rate of the pulse sequence and the progression rate of image reconstruction processing. Coil elements of the appropriate selection number are automatically selected in order of decreasing estimated receiving sensitivity to the imaging region, and the selected coil elements are used in a main scan.

Figure 9:
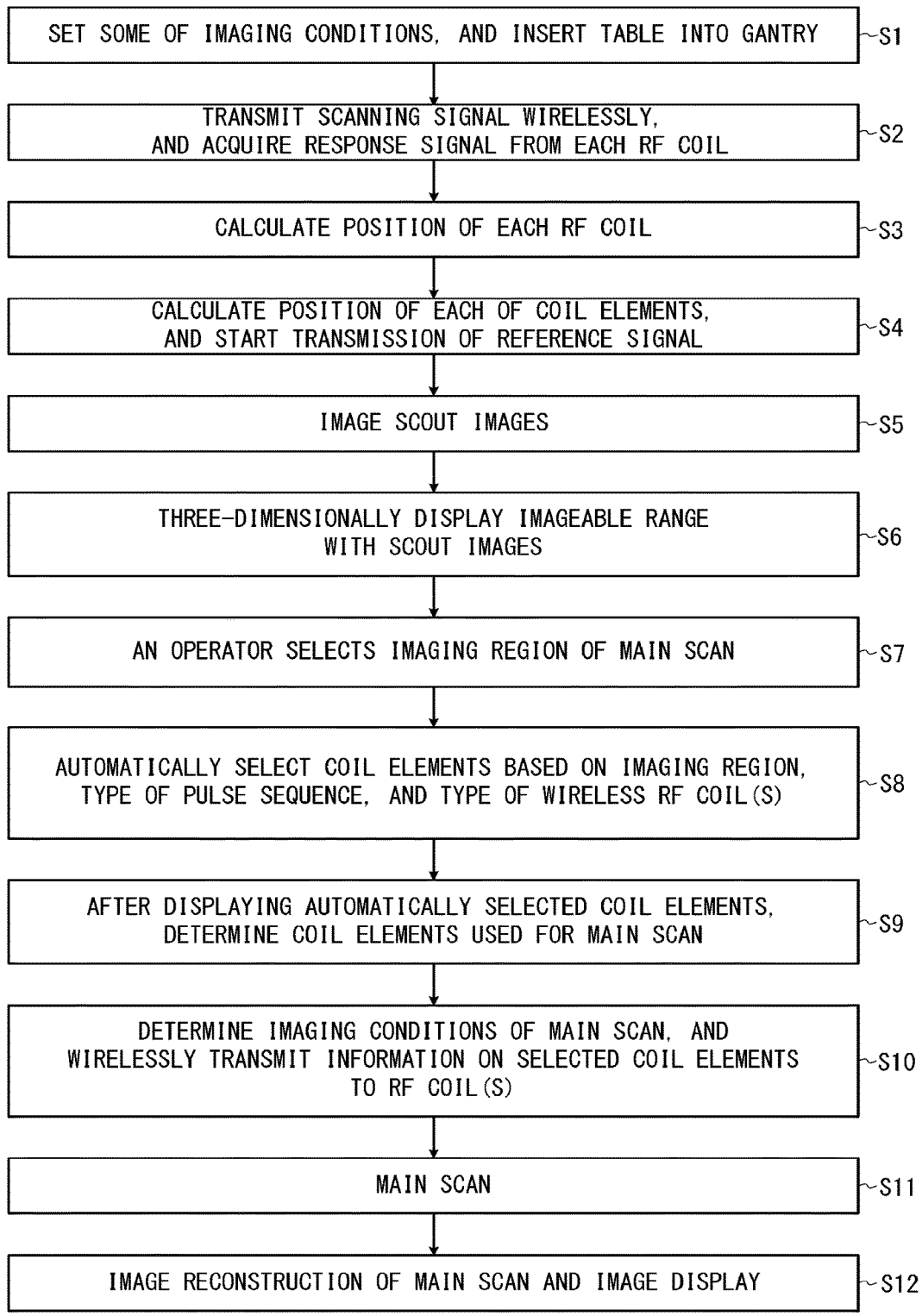
FIG. 9 is a flowchart showing an example of a flow of an operation performed by the MRI apparatus of the first embodiment.

Hereinafter, details of the first embodiment will be explained in the order of overall configuration of the MRI apparatus 10A (FIG. 1), configuration of each of wireless RF coils (FIG. 2 and FIG. 3), configuration of a digital radio communication system and a method of identifying positions of respective coil elements (FIG. 4), a method of determining the appropriate selection number of coil elements (FIG. 5 and FIG. 6), a method of selecting coil elements (FIG. 7 and FIG. 8), and a flow of an imaging operation (FIG. 9). Note that the same reference numbers are given for identical components in each figure, and duplicate explanation is omitted.

Figure 1:
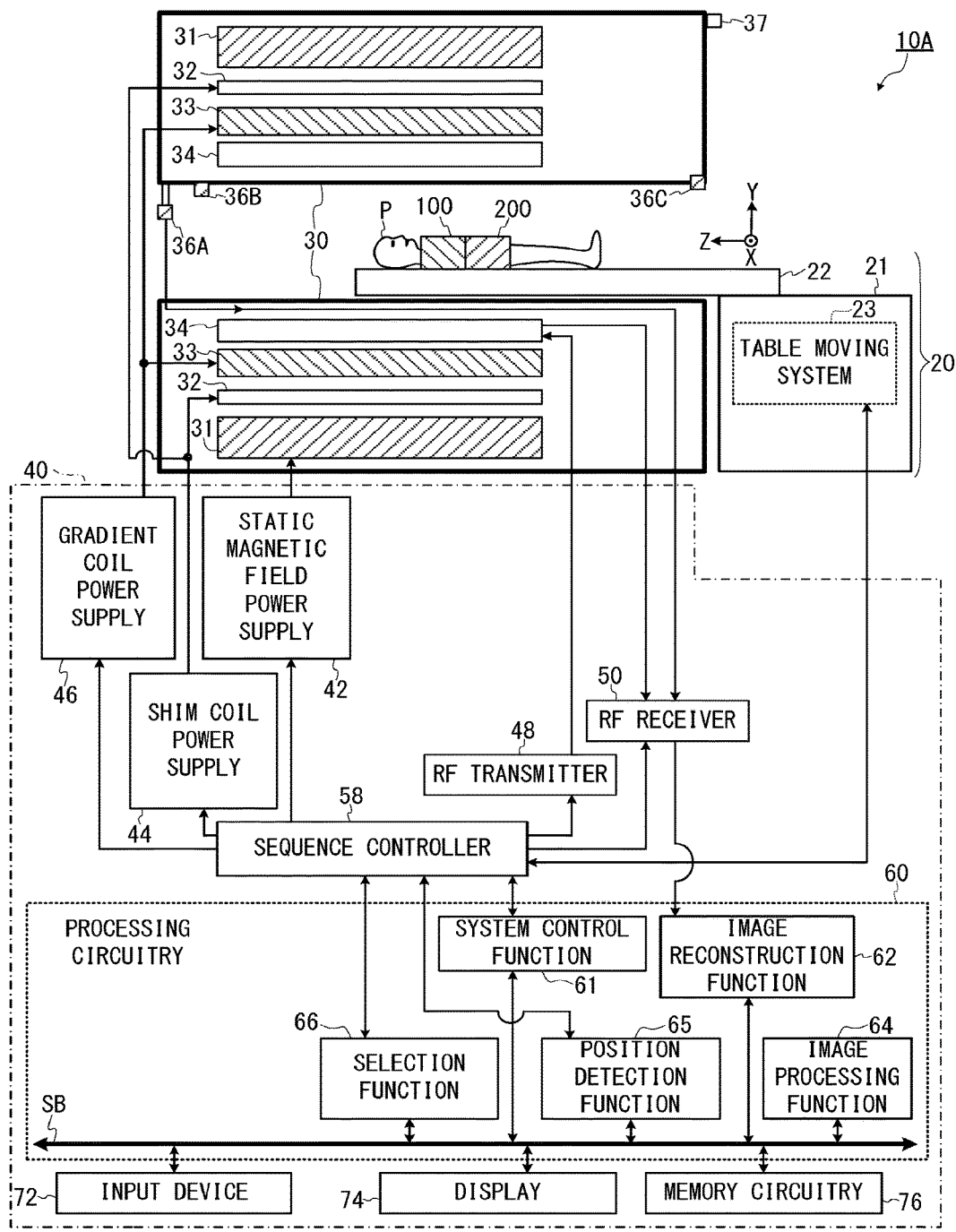
FIG. 1 is a block diagram showing an example of overall configuration of an MRI apparatus of the first embodiment.

FIG. 1 is a block diagram showing an example of overall configuration of the MRI apparatus 10A according to the first embodiment. As an example here, the components of the MRI apparatus 10A will be explained by sorting them into three groups: a bed 20, a gantry 30, and a control device 40.

Firstly, the bed 20 includes a supporting platform 21, a table 22, and a table moving system 23 disposed inside the supporting platform 21. An object P is loaded on the top surface of the table 22. As an example here, it is assumed that the wireless RF coil 100 for the chest part configured to wirelessly transmit data of MR signals and a wireless RF coil 200 for the pelvic part are attached to the object P. In addition, it is assumed that each of these wireless and mountable RF coils 100 and 200 is a part of the MRI apparatus 10A. However, this is only an example of interpretation. Each of the RF coils 100 and 200 may be interpreted as a component independent of the MRI apparatus 10A.

The supporting platform 21 supports the table 22 in such a manner that the table 22 can move in the horizontal direction (i.e., the Z axis direction in the apparatus coordinate system). The table moving system 23 adjusts the position of the table 22 in the vertical direction by adjusting the height of the supporting platform 21, when the table 22 is located outside the gantry 30. In addition, the table moving system 23 inserts the table 22 into inside of the gantry 30 by moving the table 22 in the horizontal direction and moves the table 22 to outside of the gantry 30 after completion of imaging.

Secondly, the gantry 30 is shaped in the form of a cylinder, for example, and is installed in an imaging room. The gantry 30 includes a static magnetic field magnet 31, a shim coil 32, a gradient coil 33, a whole-body RF coil 34, the control side radio communication devices 36A, 36B, and 36C, and a projector 37.

The static magnetic field magnet 31 is, for example, a superconductivity coil and shaped in the form of a cylinder. The static magnetic field magnet 31 forms a static magnetic field in an imaging space by using electric currents supplied from the static magnetic field power supply 42 of the control device 40 described below. The above-described imaging space means, for example, a space in the gantry 30 in which the object P is placed and to which the static magnetic field is applied. Note that the static magnetic field power supply 42 may be omitted by configuring the static magnetic field magnet 31 as a permanent magnet.

The shim coil 32 is, for example, shaped in the form of a cylinder and arranged inside the static magnetic field magnet 31 so as to become coaxial with the static magnetic field magnet 31. The shim coil 32 forms an offset magnetic field which uniforms the static magnetic field by consuming electric currents supplied from the shim coil power supply 44 of the control device 40 described below.

The gradient coil 33 is, for example, shaped in the form of a cylinder and arranged inside the shim coil 32. The gradient coil 33 includes a non-illustrated X axis gradient coil, a non-illustrated Y axis gradient coil, and a non-illustrated Z axis gradient coil.

In this specification, the X axis, the Y axis and the Z axis are assumed to be those of the apparatus coordinate system unless otherwise specifically noted. As an example here, the X axis, Y axis, and Z axis of the apparatus coordinate system are defined as follows.

First, the Y axis direction is defined as the vertical direction, and the table 22 is disposed in such a position that the direction of the normal line of its top surface becomes equal to the Y axis direction. The horizontal moving direction of the table 22 is defined as the Z axis direction, and the gantry 30 is installed in such a manner that its axis direction becomes equal to the Z axis direction. The X axis direction is the direction perpendicular to these Y axis direction and Z axis direction, and is the width direction of the table 22 in the example of FIG. 1.

As an example here, it is assumed that the magnetic field center is positioned at the geometric center of the gantry 30 and is the origin of the apparatus coordinate system.

The above-described X axis gradient coil forms a gradient magnetic field Gx in the X axis direction in an imaging region according to an electric current supplied from a gradient coil power supply 46 described below. Similarly, the Y axis gradient coil forms a gradient magnetic field Gy in the Y axis direction in an imaging region according to an electric current supplied from the gradient coil power supply 46. Similarly, the Z axis gradient coil forms a gradient magnetic field Gz in the Z axis direction in an imaging region according to an electric current supplied from the gradient coil power supply 46.

Thereby, directions of a gradient magnetic field Gss in a slice selection direction, a gradient magnetic field Gpe in a phase encoding direction, and a gradient magnetic field Gro in a readout (frequency encoding) direction can be arbitrarily selected as logical axes, by combining the gradient magnetic fields Gx, Gy and Gz in the X axis, the Y axis and the Z axis directions as three physical axes of the apparatus coordinate system.

The above-described imaging region means, for example, at least a part of an acquisition range of MR signals used to generate one image or one set of images, which becomes an image. The imaging region is three-dimensionally defined, for example, as a part of the imaging space by the apparatus coordinate system. For example, when MR signals are acquired in a range wider than a region made into an image in order to prevent aliasing, the imaging region is a part of the acquisition range of MR signals. On the other hand, in some cases, the entire acquisition range of MR signals becomes an image, i.e., the imaging region matches the acquisition range of MR signals. In addition, the above-described one set of images means, for example, plural images when MR signals of the plural images are acquired in a lump in one pulse sequence such as multi-slice imaging.

The whole-body RF coil 34 is, for example, shaped in the form of a cylinder and arranged inside the gradient coil 33. The whole-body RF coil 3 implements a function of applying RF pulses and a function of receiving MR signals.

The projector 37 is disposed on the entrance of the gantry 30 as an example and projects light for positioning on the table 22. The table moving system 23 controls the position of the table 22, in such a manner that the projection position is substantially positioned at the magnetic field center, when the table is moved into the bore.

The control side radio communication devices 36A, 36B, and 36C are arranged apart from each other on the internal wall of the gantry 30, for example. As an example here, the control side radio communication devices 36A and 36B are arranged on the deep side of the gantry 30 and the control side radio communication device 36C is disposed on the entrance side of the gantry 30. However, this is only an example of possible arrangement aspects. For example, the position of each of the control side radio communication devices 36A, 36B, and 36C may be replaced with each other. In addition, one of the control side radio communication devices 36A, 36B, and 36C may be arranged not at an end part but at the middle part in the Z axis direction of the gantry 30.

As an example here, the control side radio communication devices 36A, 36B, and 36C are arranged so that their X-coordinates are different from each other, their Y-coordinates are different from each other, and their Z-coordinates are different from each other, for the following reasons.

Although details are described below, the distance DA-100 between the RF coil 100 and the control side radio communication devices 36A is calculated based on the length of response time of radio communication. The same holds true for the distance DB-100 between the RF coil 100 and the control side radio communication devices 36B and the distance DC-100 between the RF coil 100 and the control side radio communication devices 36C. Afterward, the position of the RF coil 100 is determined as the intersection point between the following three spherical surfaces: (a) the spherical surface whose radius is equal to distance DA-100, and whose center is the position of the control side radio communication device 36A, (b) the spherical surface whose radius is equal to distance DB-100, and whose center is the position of the control side radio communication device 36B, and (c) the spherical surface whose radius is equal to distance DC-100, and whose center is the position of the control side radio communication device 36C.

Thus, in symmetrical arrangement in which the X-coordinates of the respective control side radio communication devices 36A, 36B, and 36C are commonly zero as an example, there is a possibility that the above-described three spherical surfaces intersects at plural points and the position of the RF coil 100 cannot be uniquely identified.

In addition, in terms of accurate measurement of each distance, it is preferable that each of the control side radio communication devices 36A, 36B, and 36C is arranged at a position, to which a wave of an electro-magnetic wave emitted from each of the RF coils 100 and 200 on the table 22 is directly reached. As an example here, the control side radio communication devices 36A, 36B, and 36C are arranged at the upper side in the vertical direction inside the bore of the gantry 30 functioning as the imaging space. This is so that the direct wave toward each of the control side radio communication devices 36A, 36B, and 36C is not interrupted by the table 22.

Thirdly, the control device 40 includes the static magnetic field power supply 42, the shim coli power supply 44, a gradient coil power supply 46, an RF transmitter 48, an RF receiver 50, a sequence controller 58, processing circuitry 60, an input device 72, a display 74, and memory circuitry 76. Although the control device 40 further includes other components such as a frequency up conversion circuit 80, a pulse waveform generation circuit 82, a fixed frequency generation circuit 84, and a variable frequency generation circuit 86, these components are omitted in FIG. 1 to avoid complicacy and are explained in FIG. 4 as described below.

The gradient coil power supply 46 supplies electric currents for forming the gradient magnetic fields Gx, Gy, and Gz to each of the above-described X axis gradient coil, the Y axis gradient coil, and the Z axis gradient coil.

The RF transmitter 48 generates RF pulse electric currents of the Larmor frequency for causing nuclear magnetic resonance according to control information inputted from the sequence controller 58, and outputs the generated RF pulse electric currents to the whole-body RF coil 34. The whole-body RF coil 34 applies RF pulses in accordance with these RF pulse electric currents to the object P.

The RF coils 100 and 200 attached to the object P and the whole-body RF coil 34 receive MR signals generated due to excited nuclear spin inside the object P by the RF pulses, and the received MR signals are inputted to the RF receiver 50.

The RF receiver 50 generates raw data which are digitized complex number data of MR signals obtained by performing predetermined signal processing on the received MR signals. The RF receiver 50 outputs the generated raw data of MR signals to the processing circuitry 60.

The sequence controller 58 stores control information needed in order to drive the gradient coil power supply 46, the RF transmitter 48, and the RF receiver 50 according to commands from the processing circuitry 60. The above-described control information includes, for example, sequence information describing operation control information such as intensity, application period and application timing of the pulse electric currents which should be applied to the gradient coil power supply 46.

The sequence controller 58 generates the gradient magnetic fields Gx, Gy and Gz and RF pulses by driving the gradient coil power supply 46, the RF transmitter 48, and the RF receiver 50 according to a predetermined sequence stored therein.

The processing circuitry 60 includes one or plural processors, for example. The above-described term "processor" includes, for instance, a processor such as a special-purpose or general-purpose CPU (Central Processing Unit), and/or a special-purpose or general-purpose signal processor. The processor of the processing circuitry implements various functions as described below by software processing (i.e., reading out one or plural programs from the memory circuitry 76 and executing the programs).

In addition, the processor of the processing circuitry 60 may be configured as hardware such as an ASIC (Application Specific Integrated Circuit) and an FPGA (Field Programmable Gate Array). Various functions of the processing circuitry 60 can also be implemented by hardware processing with the use of an ASIC, an FPGA, and/or a special-purpose electronic circuit. Additionally or alternatively, the processing circuitry 60 may implement various functions by a combination of hardware and software processing. Hereinafter, an example in which the processing circuitry 60 implements various functions described below by software processing will be explained.

As shown in FIG. 1, the processing circuitry 60 implements, for example, a system control function 61, an image reconstruction function 62, an image processing function 64, a position detection function 65, and a selection function 66 by executing programs stored in the memory circuitry 76.

The system control function 61 of the processing circuitry 60 implements system control of the MRI apparatus 10A in setting of imaging conditions of a main scan, an imaging operation, and image display after imaging through interconnection such as a system bus SB.

The above-described imaging condition refers to under what condition RF pulses and the like are applied in what type of pulse sequence, or under what condition MR signals are acquired from the object P, for example. As parameters of the imaging conditions, for example, there are an imaging region as positional information in the imaging space, a flip angle, a repetition time TR, number of slices, an imaging part, and type of pulse sequence such as spin echo and parallel imaging. The above imaging part means an anatomical region of the object P to be imaged, such as the head, the chest, and the abdomen.

The above-described main scan is a scan for imaging an intended diagnosis image such as a T1 weighted image, and it does not include a scan for acquiring MR signals for a scout image or a tuning scan. A scan is an operation of acquiring MR signals, and it does not include image reconstruction processing.

The above-described tuning scan is, for example, a scan for determining unconfirmed elements of imaging conditions, conditions and data used for image reconstruction processing and correction processing after the image reconstruction, and the tuning scan is performed separately from the main scan.

As an example of a tuning scan, there is a sequence of calculating the center frequency of the RF pulses used in the main scan. A prescan is a tuning scan which is performed before the main scan.

In addition, the system control function 61 causes the display 74 to display screen information for setting imaging conditions. Then, the system control function 61 sets the imaging conditions based on command information inputted from the input device 72, and outputs the determined imaging conditions to the sequence controller 58. Moreover, the system control function 61 causes the display 74 to display images indicated by the generated display image data after completion of imaging.

The input device 72 includes input tools such as a mouse and a keyboard and provides a user with a function to set imaging conditions and image processing conditions.

The image reconstruction function 62 of the processing circuitry 60 arranges and stores the raw data of MR signals inputted from the RF receiver 50 as k-space data, according to the phase encode step number and the frequency encode step number. The above-described k-space means a frequency space. The image reconstruction function 62 generates image data of the object P by performing image reconstruction processing including Fourier transformation on the k-space data. The image reconstruction function 62 outputs the generated image data to the image processing function 64 and stores the generated image data in the memory circuitry 76.

The image processing function 64 of the processing circuitry 60 performs predetermined image processing on the reconstructed image data, and stores the image data being subjected to the image processing in the memory circuitry 76 as display image data.

The memory circuit 76 stores the display image data after adding accompanying information such as the imaging conditions used for generating the display image data and information of the object P (i.e., patient information) to the display image data.

Incidentally, the four components including the processing circuitry 60, the input device 72, the display 74, and the memory circuitry 76 may be configured as one computer and installed in a control room, for example.

Although the components of the MRI apparatus 10A are sorted into three groups including the gantry 30, the bed 20 and the control device 40 in the above explanation, this is only an example of interpretation. For example, the table moving system 23 may be interpreted as a part of the control device 40.

Additionally or alternatively, the RF receiver 50 may be configured not as a component of the control device 40 disposed outside the gantry 30 but as a component of the gantry 30 disposed inside the gantry 30. In this case, as to output of data of MR signals to the outside of the gantry 30, for example, an optical communication cable is preferably used to transmit the data of MR signals in the form of optical digital signals. This is because the effect of external noise is reduced.

Figure 2:
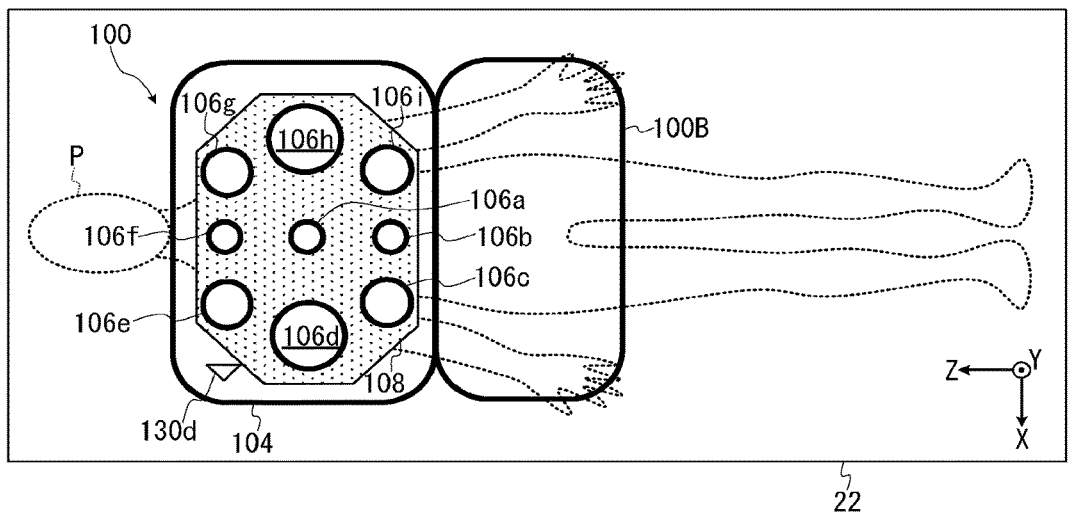
FIG. 2 is a schematic plan diagram showing an example of configuration of a wireless and mountable RF coil for the chest part.

FIG. 2 is a schematic plan view showing an example of configuration of the wireless and mountable RF coil 100 for the chest part. As shown in FIG. 2, each component of the RF coil 100 is arranged in a cover member 104 which is made of a flexible material and is capable of deformation such as folding. As such a deformable or flexible material, for example, a flexible circuit board (i.e., Flexible Printed Circuit: FPC) described in Japanese Patent Application Laid-open Publication No. 2007-229004 may be used.

The RF coil 100 includes a control circuit 108, coil elements 106a, 106b, 106c, 106d, 106e, 106f, 106g, 106h, and 106i, an antenna 130d inside the cover member 104. Although nine coil elements 106a to 106i are shown in FIG. 2, the number and arrangement of coil elements are not limited to the aspect shown in FIG. 2.

As an example here, it is assumed that the coil element 106a, 106b, and 106f are relatively small in size, the coil elements 106c, 106e, 106g, and 106i are larger in size than the coil elements 106a, 106b, and 106f, and the coil elements 106d and 106h are further larger in size than the coil elements 106c, 106e, 106g, and 106i. The above-described size means, for example, size of a loop of a conducting wire configured to detect MR signals. As to difference in receiving sensitivity depending on difference in size, it will be explained with FIG. 7 and FIG. 8 to be described below.

The control circuit 108 controls each operation of the RF coil 100. Each of the coil elements 106a to 106i detects MR signals emitted from the object P and outputs MR signals as analogue electric signals to the subsequent stage. The antenna 130d wirelessly receives the scanning signal for positional determination of the RF coil 100, and wirelessly transmits the response signal in response to this scanning signal. As to details of this operation, it will be described below using FIG. 4.

Figure 3:
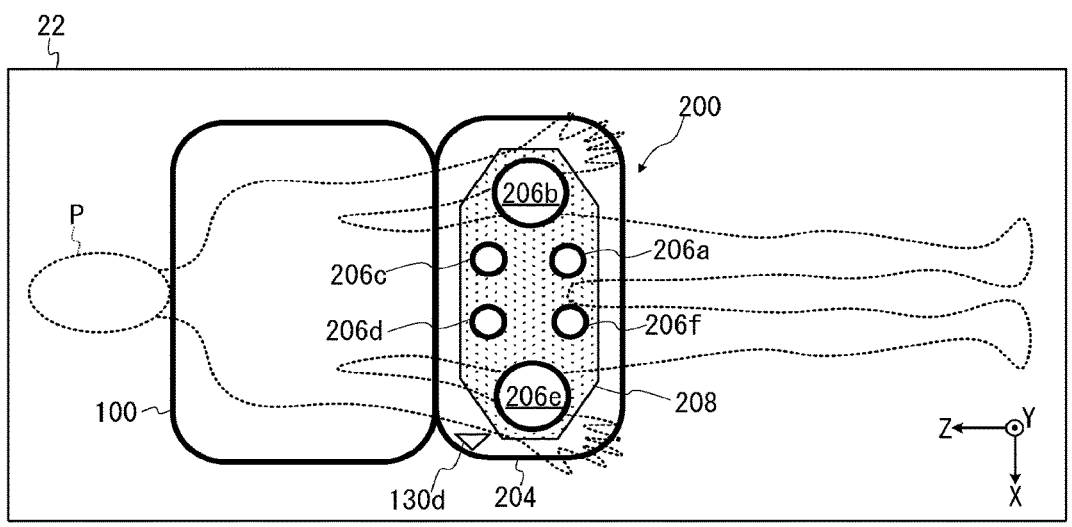
FIG. 3 is a schematic plan diagram showing an example of configuration of a wireless and mountable RF coil for the pelvic part.

FIG. 3 is a schematic plan view showing an example of configuration of the wireless and mountable RF coil 200 for the pelvic part. As shown in FIG. 3, each components of the RF coil 200 is arranged in a cover member 204 which is made of a flexible material such as an FPC and is capable of deformation such as folding.

The RF coil 200 includes a control circuit 208, coil elements 206a, 206b, 206c, 206d, 206e, and 206f, and an antenna 130d inside the cover member 204. The function of each of the coil elements 206a to 206f is similar to that of the coil elements 106a to 106i of the RF coil 100. The control circuit 208 and the antenna 130d have functions similar to the control circuit 108 and the antenna 130d of the RF coil 100, respectively. Although six coil elements 206a to 206f are shown in FIG. 3 as an example here, the number and arrangement of coil elements are not limited to the aspect of FIG. 3.

Figure 4:
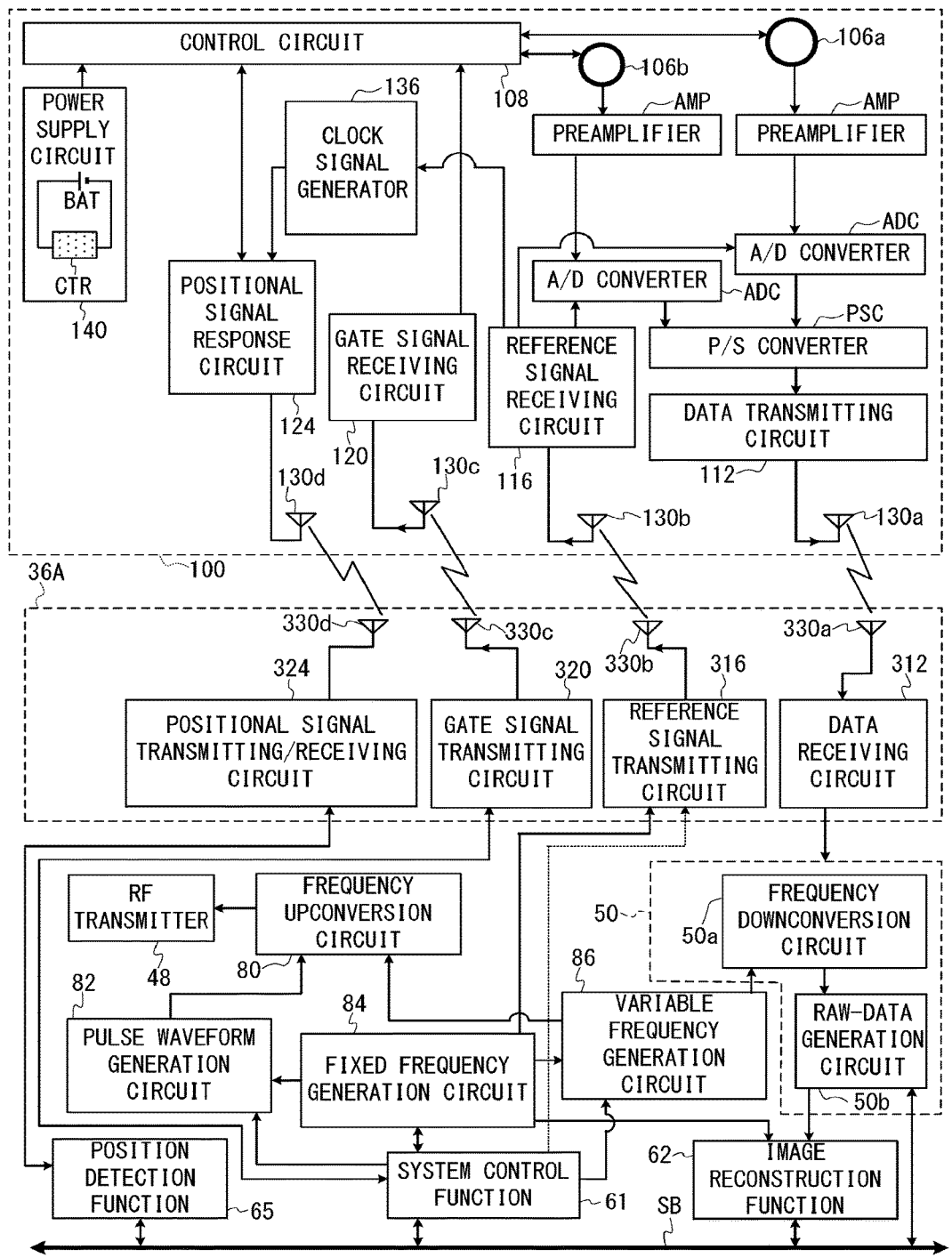
FIG. 4 is a functional block diagram showing an example of components relevant to the digital radio communication system of the MRI apparatus of the first embodiment.

FIG. 4 is a functional block diagram showing an example of components relevant to the digital radio communication system of the MRI apparatus 10A of the first embodiment.

As shown in FIG. 4, the control device 40 further includes the frequency up conversion circuit 80, the pulse waveform generation circuit 82, the fixed frequency generation circuit 84, the variable frequency generation circuit 86 in addition to components described in FIG. 1. In addition, the RF receiver 50 includes a frequency down conversion circuit 50a and a raw-data generation circuit 50b.

The control side radio communication device 36A includes a data receiving circuit 312, a reference signal transmitting circuit 316, a gate signal transmitting circuit 320, a positional signal transmitting/receiving circuit 324, and antennas 330a, 330b, 330c, and 330d. Although configuration of each of the control side radio communication devices 36B and 36C is similar to that of the control side radio communication device 36A, it is assumed that operations relevant to transmission and reception of data of MR signals are performed by the control side radio communication device 36A as an example here. Thus, it is assumed that only the positional signal transmitting/receiving circuit 324 and the antenna 330d function in each of the control side radio communication devices 36B and 36C.

However, reception/relay of data of MR signals from each of the RF coils 100 and 200 may be performed not by the control side radio communication device 36A but by the control side radio communication device 36B or 36C. Additionally or alternatively, an MR data receiving unit configured to receive data of MR signals and include necessary components for the above reception such as the data receiving circuit 312 and the antenna 330a may be arranged, for example, on the internal wall of the gantry 30 as a component independent of the control side radio communication device 36A to 36C. In other words, the operation of identifying the position of each of the RF coils and the operation of receiving data of MR signals from each of the RF coils may be performed by separate units.

In addition, the RF coil 100 includes the above-described control circuit 108, the above-described coil elements 106a to 106i, preamplifiers AMP, A/D converters ADC, a P/S (Parallel/Serial) converter PSC, a data transmitting circuit 112, a reference signal receiving circuit 116, a gate signal receiving circuit 120, a positional signal response circuit 124, antennas 130a, 130b, 130c, and 130d, a clock signal generator 136, and a power supply circuit 140.

Note that the coil elements 106c to 106i are not illustrated in FIG. 4 in order to avoid complication. Although nine preamplifiers AMP and nine A/D converter ADC are included in the RF coil 100 so as to correspond to the respective nine coil elements 106a to 106i, only two preamplifiers AMP and two A/D converter ADC corresponding to the respective the coil elements 106a and 106b are shown in FIG. 4 in order to avoid complication.

The power supply circuit 140 of the RF coil 100 includes a rechargeable battery BAT and a charging connector CTR. As an example here, it is assumed that the rechargeable battery BAT is charged by connecting the charging connector CTR to an external power supply in a period during which the RF coil 100 is not used. However, as to a method of power supply, embodiments of the present invention are not limited to such an aspect.

For example, alternating-current power may be wirelessly supplied from the whole-body RF coil 34 to the RF coil 100 by magnetically coupled resonant type power transfer, avoiding a period of applying an RF pulse and a period of detecting MR signals by the coil elements 106a to 106i. As an example of this configuration, the whole-body coil 34 may be configured by a double-resonance/doubly-tuned circuit, which resonates at the Larmor frequency as the first resonance frequency and the second resonance frequency different from the Larmor frequency, and a power receiving circuit resonating at the second resonance frequency may be separately arranged in the RF coil 100.

Although it is not shown in FIG. 4, the configuration of digital radio communication system of the RF coil 200 shown in FIG. 3 is similar to that of the RF coil 100 shown in FIG. 4, except size, shape, arrangement of the coil elements 206a to 206f and the shape of the cover member 204.

Hereinafter, the function of each component of the control device 40 which is not explained in FIG. 1 such as the fixed frequency generation circuit 84 will be first explained, and then four radio communication pathways between the control side radio communication device 36A and the RF coil 100 will be explained.

In FIG. 4, the fixed frequency generation circuit 84 generates a reference clock signal whose frequency is constant. The fixed frequency generation circuit 84 includes components for generating the reference clock signal such as a crystal controlled oscillator with high degree of stability.

The fixed frequency generation circuit 84 outputs the reference clock signal to the reference signal transmitting circuit 316 and the variable frequency generation circuit 86. In addition, the fixed frequency generation circuit 84 outputs the reference clock signal to respective components performing clock synchronization inside the MRI apparatus 10A such as the processing circuitry 60, the pulse waveform generation circuit 82, and the positional signal transmitting/receiving circuit 324.

The variable frequency generation circuit 86 includes a PLL (Phase-Locked Loop), a DDS (Direct Digital Synthesizer), and a mixer. The variable frequency generation circuit 86 operates on the basis of the above reference clock signal.

The variable frequency generation circuit 86 generates a local signal (i.e., a clock signal) of variable frequency which is equal to a setting value inputted from the system control function 61 of the processing circuitry 60 as the center frequency of RF pulses, and outputs the generated local signal to the frequency down conversion circuit 50a and the frequency up conversion circuit 80.

In order to achieve the above operation, the system control function 61 outputs a default value of the center frequency of the RF pulses to the variable frequency generation circuit 86 before a prescan. In addition, the system control function 61 outputs a corrected value of the center frequency of the RF pulses to the variable frequency generation circuit 86 after the prescan. Furthermore, the system control function 61 determines imaging conditions such as type of RF pulses, band width of each RF pulse based on imaging conditions inputted via the input device 72. The system control function 61 outputs the imaging conditions determined in the above manner to the pulse waveform generation circuit 82.

The pulse waveform generation circuit 82 generates a pulse waveform signal of baseband by using the reference clock signal inputted from the fixed frequency generation circuit 84, according to the imaging conditions inputted from the system control function 61. The pulse waveform generation circuit 82 outputs the pulse waveform signal of baseband to the frequency up conversion circuit 80.

The frequency up conversion circuit 80 multiplies the pulse waveform signal of baseband by the local signal inputted from the variable frequency generation circuit 86, then performs filter processing so that only a desired signal band passes the filter. In this manner, the frequency up conversion circuit 80 performs frequency up conversion. The frequency up conversion circuit 80 outputs the pulse waveform signal of baseband, whose frequency is raised, to the RF transmitter 48.

The RF transmitter 48 generates the RF pulses based on the inputted pulse waveform signal.

Next, four radio communication pathways between the control side radio communication device 36A and the RF coil 100 will be explained.

Firstly, a gate signal is continuously wirelessly transmitted from the gate signal transmitting circuit 320 of the control side radio communication device 36A to the gate signal receiving circuit 120 of the RF coil 100 between the antennas 330*c* and 130*c* during imaging.

More specifically, as a switch changing the on/off state of each of the coil elements 106*a* to 106*i* inside the RF coil 100, for example, a trap circuit including a PIN diode (p-intrinsic-n diode) is provided for each of the coil elements 106*a* to 106*i*. The gate signal is a control signal of the above-described switch, i.e., a signal which controls switching timing between the on-state and off-state of each trap circuit.

Incidentally, a trigger signal may be transmitted from the gate signal transmitting circuit 320 to the gate signal receiving circuit 120 so that the gate signal is generated inside the gate signal receiving circuit 120 based on the trigger signal.

In a period during which RF pulses are applied to the object P, the gate signal inputted to the RF coil 100A via the gate signal transmitting circuit 320, the antennas 330*c* and 130*c*, and the gate signal receiving circuit 120 is generally set to on-level. During the on-level period of the gate signal, the above switch becomes the off-state so as to disconnect the loop of each of the coil elements 106*a* to 106*i* and thereby each of the coil elements 106*a* to 106*i* cannot detect MR signals.

Except the period during which RF pulses are applied to the object P, the gate signal adjusted to off-level is wirelessly transmitted, for example. While the gate signal is off-level, the above switch becomes the on-state and each of the coil elements 106*a* to 106*i* can detect MR signals. Coupling effect between the RF coil for applying RF pulses to the object P such as the whole-body RF coil 34 and each of the coil elements 106*a* to 106*i* for detecting MR signals is prevented by the above-described switching operation between the on-state and the off-state.

Secondly, a digital reference signal is wirelessly transmitted from the reference signal transmitting circuit 316 of the control side radio communication device 36A to the reference signal receiving circuit 116 of the RF coil 100 between the antennas 330*b* and 130*b*.

Specifically, the reference signal is a signal which synchronizes the RF coil 100A as a transmission side of MR signals with a basic frequency of the system based on the fixed frequency generation circuit 84. The reference signal transmitting circuit 316 generates the reference signal by performing various types of processing such as modulation, frequency conversion, amplification, and filtering on the reference clock signal inputted from the fixed frequency generation circuit 84.

The reference signal receiving circuit 116 continuously output the reference signal received from the reference signal transmitting circuit 316 to each of the A/D converters during implementation term of a scan.

In addition, a trigger signal (i.e., A/D conversion start signal), which determines the sampling timing in each of the A/D converters ADC is inputted from the system control function 61 of the processing circuitry 60 to the reference signal transmitting circuit 316. The above-described sampling means, for example, to extract intensity of an analog signal at regular time intervals so that digital record is enabled. As an example here, the reference signal transmitting circuit 316 wirelessly transmits both of the reference signal and the trigger signal to the reference signal receiving circuit 116, by superimposing the trigger signal on the reference signal.

Thirdly, digitized MR signals are wirelessly transmitted from the data transmitting circuit 112 of the RF coil 100 to the data receiving circuit 312 of the control side radio communication device 36A between the antennas 130*a* and 330*a*.

Specifically, the analogue MR signals detected by at least one of the coil elements 106*a* to 106*i* are inputted to the corresponding preamplifier(s) AMP and amplified, and then inputted to the corresponding A/D converter(s) ADC and digitized. At this time, the reference signal and the trigger signal are inputted from the reference signal receiving circuit 116 to each of the A/D converters ADC. Thus, each of the A/D converters ADC starts sampling and quantization based on the reference signal (i.e., sampling clock signal) in synchronization with the timing when the trigger signal is transmitted. Each of the A/D converters ADC outputs the digitized MR signals to the P/S converter PSC.

However, if at least one coil element is not selected for detecting MR signals, the preamplifier(s) AMP and the A/D converter(s) ADC corresponding to the non-selected coil element(s) do not operate as an example here.

The P/S converter PSC converts the inputted MR signals from parallel signals to a serial signal for wireless transmission, and outputs the serial signal to the data transmitting circuit 112.

The data transmitting circuit 112 generates the digitized serial signal, in which plural MR signals are included, for wireless transmission by performing processing such as error correction encoding, interleave, modulation, frequency conversion, amplification, and filtering on the inputted serial signal. The data transmitting circuit 112 wirelessly transmits the generated serial signal for wireless transmission from the antenna 130*a* to the antenna 330*a*.

However, the present embodiment is not limited to the aspect of wirelessly transmitting MR signals as a serial signal. For example, MR signals may be wirelessly transmitted as parallel signals by increasing the number of antennas for transmitting and receiving MR signals.

The data receiving circuit 312 performs various types of processing such as amplification, frequency conversion, demodulation, deinterleave, and error correction decoding on the serial signal received by the antenna 330a. Thereby, the data receiving circuit 312 extracts the original digitized MR signals from the serial signal for radio transmission, and outputs the extracted MR signals to the frequency down conversion circuit 50a of the RF receiver 50.

The frequency down conversion circuit 50a multiplies the MR signals inputted from the data receiving circuit 312 by the local signal inputted from the variable frequency generation circuit 86, and performs filtering so that a desired signal band of the MR signals passes. Thereby, the frequency down conversion circuit 50a performs frequency down conversion on the MR signals and outputs the MR signals, whose frequency is lowered, to the raw-data generation circuit 50b.

The raw-data generation circuit 50b generates raw data of the MR signals by performing predetermined signal processing on the above MR signals whose frequency is lowered, and outputs the raw data of MR signals to the image reconstruction function 62 of the processing circuitry 60. The image reconstruction function 62 converts the raw data of MR signals into k-space data and stores the k-space data in the memory circuitry 76.

Fourthly, transmission and reception of the scanning signal and the response signal for identifying the position of the RF coil 100 are performed between the antennas 130d and 330d. As to positional identification, configuration in which the RF coil 100 side can determine the reception time of the response signal is desirable.

As an example here, the clock signal generator 136 includes a crystal controlled oscillator configured to generate a coil side clock signal whose frequency is constant and equal to the frequency of the reference clock signal generated by the fixed frequency generation circuit 84, and so on. Before reception of the reference signal by the reference signal receiving circuit 116, the clock signal generator 136 independently generates the coil side clock signal and outputs the coil side clock signal to the positional signal response circuit 124. After reception of the reference signal by the reference signal receiving circuit 116, the clock signal generator 136 generates the coil side clock signal which is synchronized with the reference clock signal, based on the reference signal inputted via the reference signal receiving circuit 116.

The position detection function 65 of the processing circuitry 60 outputs a command to transmit the inquiry signal for identifying the positions of the respective RF coils 100 and 200 to the positional signal transmitting/receiving circuit 324 of the control side radio communication device 36A, when the position of the table 22 is fixed to the first imaging position as an example.

In synchronization with reception of the command to transmit the inquiry signal, the positional signal transmitting/receiving circuit 324 generates the inquiry signal of the predetermined frequency including the identification information of the control side radio communication device 36A, so that this inquiry signal can be distinguished from the control side radio communication devices 36B and 36C. Afterward, the positional signal transmitting/receiving circuit 324 causes the antenna 330d to radiate an electromagnetic wave of the inquiry signal to a space. At this time, the positional signal transmitting/receiving circuit 324 calculates and stores the transmission time of the inquiry signal based on the above-described reference clock signal.

The positional signal response circuit 124 receives the inquiry signal by the antenna 130d, and calculates and stores the reception time of the inquiry signal based on the coil side clock signal inputted from the clock signal generator 136. Afterward, the positional signal response circuit 124 generates the response signal of the frequency unique to the RF coil 100, so that the identification information of the RF coil 100 is included in the response signal to be generated as identification information of transmission source as an example. In other words, the positional signal response circuit 124 generates the response signal whose frequency is different from a frequency of any one of other RF coils. The positional signal response circuit 124 causes the antenna 130d to radiate an electromagnetic wave of the response signal, so that its transmission time is delayed from the reception time of the inquiry signal by the predetermined delay time.

As an example here, the frequency of the response signal of the RF coil 100 and the frequency of the response signal of the RF coil 200 are set to values different from each other as mentioned above, and thereby the positional signal response circuit 124 can easily identify which RF coil is the transmission source of each of the response signals.

However, the above-described configuration is only an example for simplifying the explanation. For example, when temporal transmission order of the response signal is set for each of the RF coils 100 and 200, the frequency of the response signal of each of the RF coils 100 and 200 may be unified. As a method of setting the temporal transmission order of the response signal of each of the RF coils 100 and 200, for example, the delay time from the reception time of the inquiry signal to the transmission time of the response signal may be set to a different value for each of the RF coils.

The positional signal transmitting/receiving circuit 324 receives the response signal from the RF coil 100 by the antenna 330d, and calculates and stores the reception time of this the response signal based on the above-described reference clock signal. In addition, the positional signal transmitting/receiving circuit 324 acquires the identification information of the RF coil 100 included in the received response signal by analyzing this response signal.

Thereby, the positional signal transmitting/receiving circuit 324 calculates and stores the response time obtained by subtracting the above-described predetermined delay time from time difference between the transmission time of the inquiry signal and the reception time of the response signal from the RF coil 100, as TA-100.

Although it is not illustrated in FIG. 4, the inquiry signal radiated from the control side radio communication device 36A is also received by the antenna and the positional signal response circuit of the RF coil 200. At the timing delayed from this reception time by the same delay time as the RF coil 100, an electromagnetic wave of the response signal, which has a frequency unique to the RF coil 200 and includes the identification information of the RF coil 200, is radiated from the RF coil 200.

Then, the positional signal transmitting/receiving circuit 324 of the control side radio communication device 36A calculates and stores the reception time of the response signal from the RF coil 200, and acquires the identification information of the RF coil 200 from this response signal in a similar manner as described above. Afterward, the positional signal transmitting/receiving circuit 324 calculates and stores the response time obtained by subtracting the above-described delay time from time difference between the transmission time of the inquiry signal and the reception time of the response signal from the RF coil 200, as TA-200.

The positional signal transmitting/receiving circuit 324 outputs the identification information of each of the RF coils 100 and 200 and the response times TA-100 and TA-200 of the respective RF coils 100 and 200 to the position detection function 65 of the processing circuitry 60. The position detection function 65 outputs the identification information of each of the RF coils 100 and 200 to the system control function 61 of the processing circuitry 60, and thereby the system control function 61 recognizes that the RF coils 100 and 200 are normally attached.

The response time TA-100 in response to the inquiry signal is a value which changes depending on the distance between the antenna 330d of the control side radio communication device 36A and the antenna 130d of the RF coil 100. Thus, the position detection function 65 calculates and stores the distance between the antenna 330d of the control side radio communication device 36A and the antenna 130d of the RF coil 100 based on the response time TA-100, as DA-100. Similarly, the position detection function 65 calculates and stores the distance between the antenna 330d of the control side radio communication device 36A and the antenna 130d of the RF coil 200 based on the response time TA-200, as DA-200.

After calculating the distances DA-100 and DA-200 between the control side radio communication device 36A and each of the RF coils 100 and 200, the position detection function 65 outputs a command to transmit the above-described inquiry signal to the non-illustrated positional signal transmitting/receiving circuit 324 of the control side radio communication device 36B. Then, an operation similar to the above-described operation is performed (a) between the control side radio communication device 36B and the RF coil 100 and (b) between the control side radio communication device 36B and the RF coil 200, simultaneously.

In other words, the positional signal transmitting/receiving circuit 324 of the control side radio communication device 36B calculates the response time obtained by subtracting the above-described delay time from the time difference between the transmission time of the inquiry signal and the reception time of the response signal from the RF coil 100, as TB-100. In addition, the positional signal transmitting/receiving circuit 324 of the control side radio communication device 36B calculates the response time obtained by subtracting the above-described delay time from the time difference between the transmission time of the inquiry signal and the reception time of the response signal from the RF coil 200, as TB-200.

Afterward, the position detection function 65 calculates and stores the distance between the antenna 130d of the RF coil 100 and the control side radio communication device 36B as DB-100, and calculates and stores the distance between the antenna 130d of the RF coil 200 and the control side radio communication device 36B as DB-200, in a similar manner as described above.

After calculating the distances DB-100 and DB-200 between the control side radio communication device 36B and each of the RF coils 100 and 200, the position detection function 65 outputs a command to transmit the above-described inquiry signal to the non-illustrated positional signal transmitting/receiving circuit 324 of the control side radio communication device 36C. Then, an operation similar to the above-described operation is performed (a) between the control side radio communication device 36C and the RF coil 100 and (b) between the control side radio communication device 36C and the RF coil 200, simultaneously.

In other words, the positional signal transmitting/receiving circuit 324 of the control side radio communication device 36C calculates the response time obtained by subtracting the above-described delay time from the time difference between the transmission time of the inquiry signal and the reception time of the response signal from the RF coil 100, as TC-100 in a similar manner as described above. In addition, the positional signal transmitting/receiving circuit 324 of the control side radio communication device 36C calculates the response time obtained by subtracting the above-described delay time from the time difference between the transmission time of the inquiry signal and the reception time of the response signal from the RF coil 200, as TC-200.

Afterward, the position detection function 65 calculates and stores the distance between the antenna 130d of the RF coil 100 and the control side radio communication device 36C as DC-100, and calculates and stores the distance between the antenna 130d of the RF coil 200 and the control side radio communication device 36C as DC-200, in a similar manner as described above.

The position detection function 65 stores the position of the antenna 330d of each of the control side radio communication devices 36A, 36B, and 36C in the apparatus coordinate system.

The position detection function 65 calculates and stores the intersection point between the following three spherical surfaces as the position of the antenna 130d of the RF coil 100: (a) the spherical surface whose radius is equal to the distance DA-100, and whose center is the position of the antenna 330d of the control side radio communication device 36A, (b) the spherical surface whose radius is equal to the distance DB-100, and whose center is the position of the antenna 330d of the control side radio communication device 36B, and (c) the spherical surface whose radius is equal to the distance DC-100, and whose center is the position of the antenna 330d of the control side radio communication device 36C.

In addition, the position detection function 65 stores (a) the position of antenna 130d as the positional signal response circuit inside the RF coil, (b) the number of coil elements, and (c) the arrangement data of the included coil elements, for each identification information of all the RF coils (100, 200, and the like) which can be used with the MRI apparatus 10A.

Furthermore, the position detection function 65 acquires the posture of the object P on the table 22 based on the imaging conditions inputted to the MRI apparatus 10A via the input device 72. The above-described posture means information such as (a) the body axis of the object P on the table 22 is along the Z axis direction, (b) the object P is laid on the table 22 with the head on the deep side of the gantry 30, (c) a face-down position, and (d) a face-down position. The arrangement direction of the RF coil 100 attached to the object P (e.g., the RF coil 100 is attached so that its antenna 130d is located to the positive side in the Z axis direction) can be substantially determined by the posture of the object P.

Thus, the position detection function 65 calculates and stores the position of each of the coil elements 106a to 106i, based on (a) the arrangement direction of the RF coil 100 on the table 22 determined in the above manner, (b) the arrangement data of the coil elements 106a to 106i inside the RF coil 100, and (c) the position of the antenna 130d of the RF coil 100 calculated by the above-described manner. The above-described position of each of the coil elements 106a to 106i means, for example, the position of the geometric center of each of the coil elements 106a to 106i defined in the apparatus coordinate system.

The position detection function 65 calculates and stores the position of the antenna 130d of the RF coil 200 based on the intersection point between the three spherical surfaces in a similar manner as described above. In addition, the position detection function 65 calculates and stores the position of each of the coil elements 206a to 206f, based on the arrangement direction of the RF coil 200, the arrangement data of the coil elements 206a to 206f inside the RF coil 200, and the position of the antenna 130d of the RF coil 200.

The foregoing is the explanation of the four radio communication pathways and methods of identifying the position of each of coil elements in the RF coils.

Figure 5:
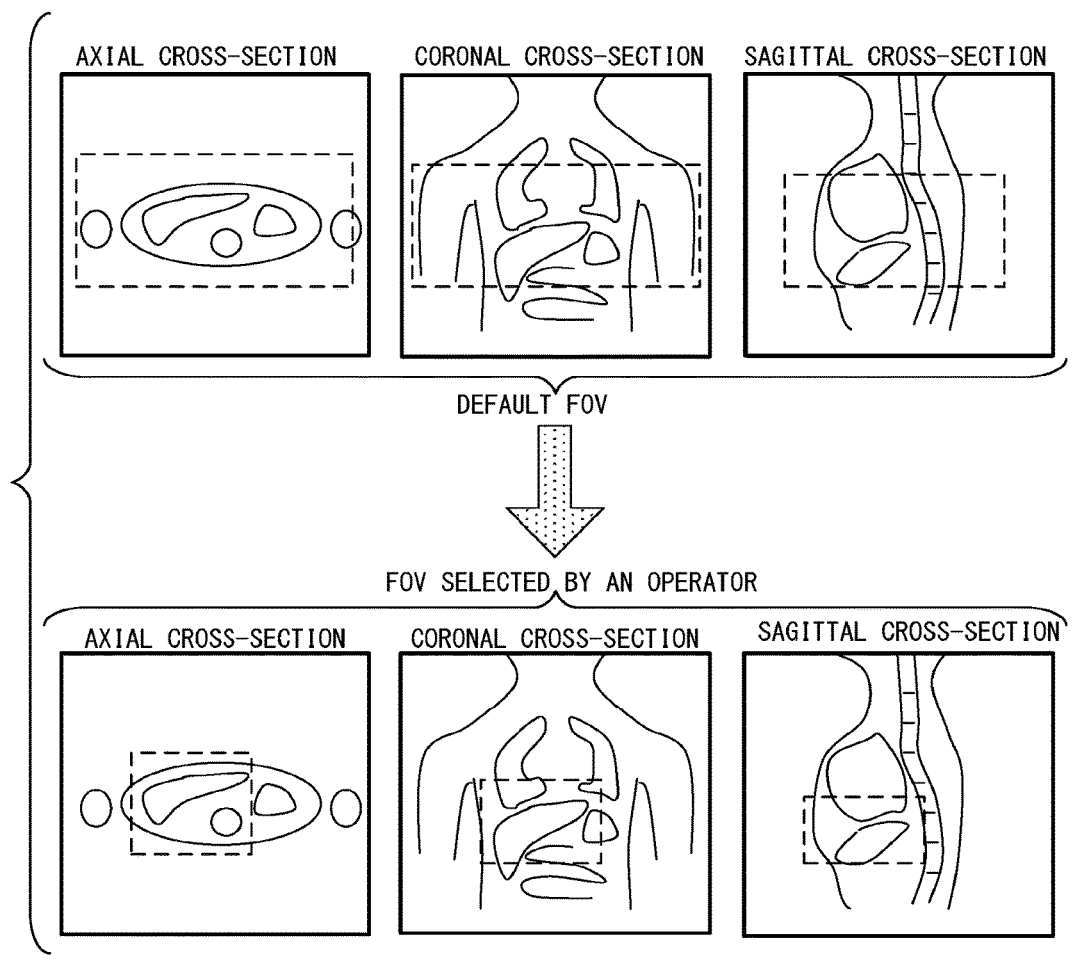
FIG. 5 is a schematic plan diagram showing an example of a method of setting an imaging region based on scout images displayed on a display.

FIG. 5 is a schematic diagram showing an example of a method of setting an imaging region based on scout images displayed on the display 74. The upper part of FIG. 5 shows three scout images of an axial cross-section, a coronal cross-section, and a sagittal cross-section in the order from the left.

The above-described axial cross-section, coronal cross-section, and sagittal cross-section are notation based on the patient coordinate system. As an example here, the X axis, the Y axis and the Z axis of the patient coordinate system are defined as follows. That is, the right-to-left direction of the object P is defined as the X axis direction. The front-to-rear direction of the object P is defined as the Y axis direction, assuming that the abdominal side is the front and the back side is the rear. In addition, the topside-to-downside direction of the object P is defined as the Z axis direction, assuming that the head side is topside and the foot side is downside along the direction of a straight-line approximation of the backbone.

Moreover, an X-Y plane of the patient coordinate system is defined as an axial plane, an X-Z plane of the patient coordinate system is defined as a coronal plane, and a Y-Z plane of the patient coordinate system is defined as a sagittal plane.

In the upper part of FIG. 5, the default imaging region equivalent to an FOV (Field Of View) when viewed planarly is shown by a broken line frame. An operator can select a desired imaging region by moving, enlarging, or diminishing the broken line frame via the input device 72. As an example here, the bold line frame along the outer rim of each image indicates the maximum range which can be set as an imaging region.

The lower part of FIG. 5 similarly shows three scout images of an axial cross-section, a coronal cross-section, and a sagittal cross-section, and the broken line frame on each image indicates the imaging region. The lower part of FIG. 5 shows the state in which the imaging region has been selected by a user. In the first embodiment, the imaging region selected in the above manner is one of factors of determining the appropriate selection number of coil elements.

FIG. 6 is a chart showing an example of the appropriate selection number of coil elements determined based on a combination of RF coils, type of pulse sequence, and an imaging region.

For example, in a comparatively slow pulse sequence such as a spin echo technique and in a pulse sequence having long vacant time in each repetition time, the rate of wirelessly transmitting data of MR signals from each wireless RF coil to the control side radio communication device 36A can follow the progression rate of the pulse sequence and/or the image reconstruction processing even if the number of selected coil elements is large. Additionally, in a fast spin echo technique, a three-dimensional imaging region is often imaged. In this case, reception of MR signals from a comparatively wide region is required and thus it is necessary to set the number of selected coil elements to a large number.

However, when the number of selected coil elements is large in a rapid pulse sequence such as EPI (Echo Planar Imaging), the rate of wirelessly transmitting data of MR signals from each wireless RF coil to the control side radio communication device 36A cannot follow the progression rate of the pulse sequence and/or the image reconstruction processing. On the other hand, image quality deteriorates depending on other imaging conditions if the number of selected coil elements is too small. Additionally, a two-dimensional imaging region (i.e., a slice) is often imaged in EPI. In this case, it is enough to receive MR signals from a comparatively narrow region and thus the number of selected coil elements can be set to a small number.

For the above reasons, the selection function 66 preliminarily stores table data which gives the appropriate selection number of coil elements depending on various types of conditions, when the MRI apparatus 10A is initially installed, for example. The above-described various types of conditions mean, for example, at least three conditions including (a) a combination of RF coils to be used, (b) type of pulse sequence, and (c) the imaging region.

In addition, the above-described appropriate selection number means the upper limit number of coil elements to be selected, by which the rate of wirelessly transmitting data of MR signals to the control side radio communication device 36A side can follow the progression rate of the pulse sequence and/or the image reconstruction processing, for example.

As an example of the appropriate selection number, consider a case where the rate of wirelessly transmitting data of MR signals can follow the progression rate of the pulse sequence and/or the image reconstruction processing even under the condition of selecting all the coil elements. In this case, the number of all the coil element may be determined as the appropriate selection number. Also in this case, the number of coil elements, which is smaller than the number of all the coil elements but is enough to obtain sufficiently satisfactory image quality, may be determined as the appropriate selection number.

Additionally, the number of coil elements slightly smaller than the upper-limit number of coil elements, by which the rate of wirelessly transmitting data of MR signals can follow the progression rate of the pulse sequence and/or the image reconstruction processing, may be determined as the appropriate selection number in consideration of the possibility of a radio communication error.

Furthermore, the above-described table data can be generated before installation of the MRI apparatus 10A by simulation and/or experiments.

The leftmost column in FIG. 6 shows various patterns of imaging regions as one of factors of determining the appropriate selection number. The imaging region indicated in the leftmost column in FIG. 6 may be a region defined based on an anatomical imaging part such as a cerebrum, a heart, and a right lung, or may be a region defined by a position and size of an FOV. Additionally or alternatively, the imaging region indicated in the leftmost column in FIG. 6 may be a region defined by a combination of an anatomical imaging part and a position and size of an FOV. Although only size of each two-dimensional imaging region such as 20 cm×20 cm is indicated in FIG. 6, size patterns of three-dimensional imaging regions in the case of acquiring volume data are actually included in the table data.

The second leftmost column in FIG. 6 shows type of pulse sequence as one of factors of determining the appropriate selection number. Although an FSE (Fast Spin Echo) sequence and an EPI sequence are illustrated as an example here, all the types of pulse sequence which can be performed by the MRI apparatus 10A are actually included in the table data.

Incidentally, if an acceleration factor, (or a reduction factor) as a parameter of parallel imaging is large, skipped lines in the phase encode direction are increased, resulting that amount of data of MR signals are decreased. Thus, the appropriate selection number is determined depending on the acceleration factor of parallel imaging, so that sufficient amount of data of MR signals for performing image reconstruction are obtained.

The third leftmost column in FIG. 6 shows type of the RF coil(s) as one of the factors of determining the appropriate selection number. All the combination patterns of the RF coils which are possibly used are included in the third leftmost column of the table data, such as a case of using only a wireless RF coil for the head part and another case of using only a wireless RF coil for the chest part. As the RF coils which are possibly used, RF coils to be connected with a non-illustrated connector on the table 22 of the MRI apparatus 10A by wire are included.

The selection function 66 determines the appropriate selection number of coil elements by searching the table data for the row at which the combination of the three conditions including the imaging region, type of pulse sequence, and the RF coils matches that of the main scan.

When the imaging region in any row in the table does not perfectly match the actual imaging region of the main scan, the selection function 66 searches the table data for the imaging region closest to the actual imaging region of the main scan. Then, the selection function 66 determines the appropriate selection number by using the closest the imaging region. In addition, each appropriate selection number shown in FIG. 6 is only an example for concretizing the explanation, and should not be interpreted as limiting the present embodiment.

Figure 7:
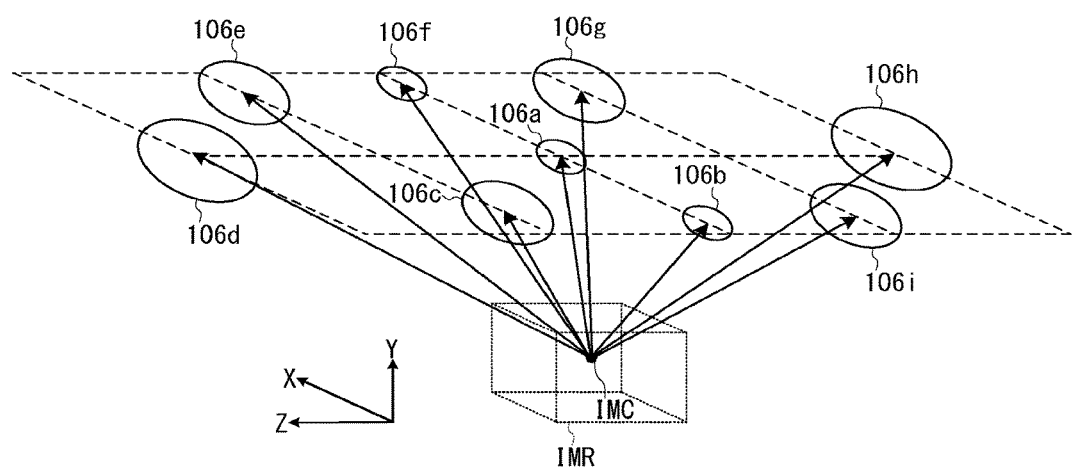
FIG. 7 is a schematic oblique diagram showing an example of distance relationship between the center of the imaging region and each of coil elements of the RF coil.

FIG. 7 is a schematic diagram showing an example of distance relationship between the center IMC of the imaging region IMR and each of the coil elements 106a to 106i of the RF coil 100.

FIG. 8 is a chart showing an example of table data of the sensitivity correction coefficients, by which receiving sensitivity of each of the coil elements 106a to 106i is corrected according to the distance from the center IMC of the imaging region IMR.

The above-described sensitivity correction coefficient means a coefficient indicative of a value of receiving sensitivity of a certain coil element at each distance DD, when the receiving sensitivity of this coil element within its extremely short distance is treated as the reference value (i.e., 1.0). Hereinafter, how coil elements of the appropriate selection number are selected will be explained by reference to FIG. 7 and FIG. 8.

It is preferable that coil elements of the appropriate selection number are selected in order of decreasing receiving sensitivity to MR signals emitted from the determined imaging region. Receiving sensitivity of any one of the coil elements 106a to 106i decreases as it is more separated from the emission source of MR signals.

Thus, the selection function 66 may select coil elements of the appropriate selection number simply in order of increasing distance from the center IMC of the imaging region IMR. Additionally, as concretely explained hereinafter, coil elements may be selected in order of decreasing receiving sensitivity to MR signals whose emission source is the center IMC of the imaging region IMR, by estimating the above receiving sensitivity with the use of the sensitivity correction coefficients depending on the distance DD from the center IMC of the imaging region IMR.

More specifically, in the example of FIG. 7, smaller coil elements in size such as the coil elements 106a, 106b, and 106f have higher receiving sensitivity to MR signals emitted within extremely short distance. However, receiving sensitivity of such smaller coil elements rapidly decreases as these coil elements are more separated from the emission source of MR signals.

Larger coil elements in size such as the coil elements 106d and 106h have lower receiving sensitivity within extremely short distance than smaller coil elements in size. However, decrease of receiving sensitivity of such larger coil elements is slower than small coil elements, when they are more separated from the emission source of MR signals.

The extremely short distance at which receiving sensitivity of each coil element becomes maximum as the reference value is assumed to be within 10 cm and the maximum value of the distance DD from the center IMC of the imaging region IMR is assumed to be over 40 cm in FIG. 8 for simplifying the explanation. This is because a coil element separated from the center of the imaging region by the distance larger than the above maximum distance DD 40 cm is rarely selected in actual imaging. However, classification of the distance DD shown in FIG. 8 is only an example. For example, the sensitivity correction coefficients may be indicated for more finely classified groups of the distance DD, so that the difference between the respective groups becomes 2 cm. As to the distance DD over 40 cm, the sensitivity correction coefficients may be indicated for more finely classified groups of the distance DD in a similar manner.

As shown in FIG. 8, since the coil element 106a is small in size, its sensitivity correction coefficient decreases to 0.5 when the distance DD from the center IMC of the imaging region IMR exceeds 40 cm. On the other hand, since the coil element 106h is large in size, its sensitivity correction coefficient decreases but keeps the value of 0.8 when the distance DD from the center IMC of the imaging region IMR exceeds 40 cm. Note that values of the sensitivity correction coefficients shown in the rightmost column of FIG. 8 are only examples for concretizing the explanation and they should not be interpreted as limiting the present embodiment.

Data of the sensitivity correction coefficients like FIG. 8 can be generated by simulation and/or experiments at the time of manufacturing the RF coil 100, and are stored in the selection function 66 of the processing circuitry 60 from the installation time of the MRI apparatus 10A.

Moreover, the selection function 66 of the processing circuitry 60 also stores data in which the reference receiving sensitivity (i.e., the maximum receiving sensitivity) of each coil element within the extremely short distance is indicated as, e.g., an amplitude value of current generated by an MR signal of predetermined intensity.

Thus, the selection function 66 calculates the distance DD from the center IMC of the imaging region IMR for each of the coil elements 106a to 106i, based on the position of each of the coil elements 106a to 106i inputted from the position detection function 65 and the imaging region IMR of the main scan inputted from the system control function 61.

The selection function 66 calculates the estimated receiving sensitivity of each of the coil elements 106a to 106i, by multiplying the reference receiving sensitivity of each of the coil elements 106a to 106i by the sensitivity correction coefficient uniquely determined from the above-described table data according to the calculated distance DD6. Then, the selection function 66 selects coil elements of the appropriate selection number in order of decreasing estimated receiving sensitivity.

FIG. 9 is a flowchart illustrating an example of a flow of an operation performed by the MRI apparatus 10A of the first embodiment. Hereinafter, according to the step numbers in the flowchart shown in FIG. 9, the operation performed by the MRI apparatus 10A will be described by reference to the above-mentioned FIG. 1 to FIG. 8 as required.

[Step S1] The system control function 61 (FIG. 1) sets some of imaging conditions of the main scan such as the posture of the object P on the table 22 and type of pulse sequence, based on the imaging conditions inputted to the MRI apparatus 10A via the input device 72.

In addition, the RF coils 100 and 200 are attached to the object P, under the state where the table 22 is located at a predetermined position on the supporting platform 21 outside the gantry 30. Next, an operator fixes a projection position of positioning light of the projector 37 to the point of the object P which should be located at the magnetic field center after horizontally moving the table 22. Next, the table moving system 23 horizontally moves the table 22 into inside of the gantry 30 so that the finally fixed projection position is located at the magnetic field center, and fixes the position of the table 22.

Afterward, the processing proceeds to the Step S2.

[Step S2] When the position of the table 22 is fixed, the position detection function 65 outputs the instruction to transmit the scanning signal to the positional signal transmitting/receiving circuit 324 (FIG. 4) of the control side radio communication device 36A as described above, responding to the fixation of the position of the table 22. Afterward, the position detection function 65 acquires identification information of each of the RF coils 100 and 200 as described above, and calculates the distance DA-100 between the control side radio communication device 36A and the RF coil 100 and the distance DA-200 between the control side radio communication device 36A and the RF coil 200.

Next, the position detection function 65 outputs the instruction to transmit the scanning signal to the positional signal transmitting/receiving circuit 324 of the control side radio communication device 36B, and similarly calculates the distance DB-100 between the control side radio communication device 36B and the RF coil 100 and the distance DB-200 between the control side radio communication device 36B and the RF coil 200.

Next, the position detection function 65 outputs the instruction to transmit the scanning signal to the positional signal transmitting/receiving circuit 324 of the control side radio communication device 36C, and similarly calculates the distance DC-100 between the control side radio communication device 36C and the RF coil 100 and the distance DC-200 between the control side radio communication device 36C and the RF coil 200.

Afterward, the processing proceeds to the Step S3.

[Step S3] The position detection function 65 calculates and stores the intersection point between the following three spherical surfaces as the position of the antenna 130d of the RF coil 100: (a) the spherical surface whose radius is equal to the distance DA-100, and whose center is the position of antenna 330d of the control side radio communication device 36A, (b) the spherical surface whose radius is equal to the distance DB-100, and whose center is the position of antenna 330d of the control side radio communication device 36B, and (c) the spherical surface whose radius is equal to the distance DC-100, and whose center is the position of the antenna 330d of the control side radio communication device 36C. Similarly, the position detection function 65 calculates and stores the position of the antenna 130d of the RF coil 200.

Afterward, the processing proceeds to the Step S4.

[Step S4] The position detection function 65 acquires the posture of the object P as one of imaging conditions from the system control function 61 of the processing circuitry 60. Then, the position detection function 65 calculates and stores the position of each of the coil elements 106a to 106i, based on the arrangement direction of the RF coil 100 determined from the posture, the arrangement data of the coil elements 106a to 106i inside the RF coil 100, and the position of the antenna 130d of the RF coil 100.

The position detection function 65 calculates the position of the antenna 130d of the RF coil 200 and then calculates and stores the position of each of the coil elements 206a to 206f of the RF coil 200, in a similar manner as described above.

In addition, the position detection function 65 outputs the identification information of each of the RF coils 100 and 200 to the system control function 61. Thereby, the system control function 61 recognizes that the RF coils 100 and 200 are normally attached to the object P.

After recognizing normal attachment, the system control function 61 outputs a communication permission command, by which further communication between the control side radio communication device 36A and the respective RF coils 100 and 200 is permitted, to each component such as the reference signal transmitting circuit 316.

The reference signal transmitting circuit 316 starts inputting the digital reference signal to the reference signal receiving circuit 116 via the radio communication pathway between the antennas 330b and 130b, according to the communication permission command. Transmission of the reference signal is continued until completion of the main scan, for example. Note that the trigger signal for determining the sampling timing is superimposed on the reference signal transmitted from the reference signal transmitting circuit 316.

Afterward, the processing proceeds to the Step S5.

[Step S5] The system control function 61 causes each component of the MRI apparatus 10A to perform prescans. In one of the prescans as an example, a corrected value of the center frequency of RF pulses is calculated.

In addition, the selection function 66 selects coil elements positioned within a predetermined range from the center of the imaging region for acquiring MR signals of scout images as an example, and transmits information on the selected coil elements to the control circuits 108 and 208 of the respective RF coils 100 and 200 via one of the radio communication pathways. The information on the coil elements selected for acquiring MR signals of scout images can be transmitted via the radio communication pathway between the antennas 330d and 130d, for example.

Here, the problem that the rate of wirelessly transmitting data of MR signals to the control side of the MRI apparatus does not follow the progression rate of the pulse sequence and/or the image reconstruction processing does not occur in imaging of scout images. This is because the number of scout images is small and high resolution is not generally required for scout images, i.e., the pixel number of each of scout images is smaller than each of images obtained in the main scan.

Next, the system control function 61 controls each component of the MRI apparatus 10A, so that the MRI apparatus 10A performs a scan of acquiring MR signals of scout images. Specifically, the static magnetic field has been already formed in the imaging space by the static magnetic field magnet 31 excited by the static magnetic field power supply 42. In addition, the shim coil 32 forms an offset magnetic field, which uniforms the static magnetic field formed in the imaging space, by using electric currents supplied from the shim coil power supply 44.

Moreover, the gate signal is continuously wirelessly transmitted from the gate signal transmitting circuit 320 to the gate signal receiving circuit 120 between the antennas 330c and 130c during the scan of acquiring MR signals of scout images.

Afterward, when an instruction to start imaging is inputted to the system control function 61 of the processing circuitry 60 from the input device 72, MR signals emitted from the object P are acquired by repeating the processing composed of the following sub-steps <1> to <4>.

<1> The sequence controller 58 drives the gradient coil power supply 46, the RF transmitter 48, and the RF receiver 50 according to the pulse sequence for scout images inputted from the system control function 61, so that gradient magnetic fields are formed in the imaging region including the imaging part of the object P and each RF pulse is applied to the object P by the whole-body RF coil 34. Only during the application period of the RF pulses, the gate signal is set to, for example, on-level. Thereby, each of the coil elements 106a to 106i and 206a to 206f of the RF coils 100 and 200 becomes the off-state and the coupling effect is prevented.

<2> The gate signal is switched over to, for example, off-level after application of the RF pulses, and each of the coil elements 106a to 106i and 206a to 206f detects the MR signals caused by the nuclear magnetic resonance inside the object P.

Note that the control circuits 108 and 208 of the respective RF coils 100 and 200 put each of the preamplifier (s) AMP and A/D converter(s) ADC corresponding to each non-selected coil element into a non-operating state (FIG. 4). In other words, only the preamplifiers AMP and the A/D converters ADC corresponding to the coil elements selected by the selection function 66 (out of the coil elements 106a to 106i and 206a to 206f) operate.

Thus, analogue MR signals detected by each of the selected coil elements are inputted to the corresponding preamplifier AMP and amplified, and then inputted to the corresponding A/D converter ADC.

<3> Each of the A/D converters ADC corresponding to each of the selected coil elements starts sampling and quantization of the MR signals based on the reference signal in synchronization with the wirelessly transmitted timing of the trigger signal, and outputs the digitized MR signals to the P/S converter PSC. The P/S converter PSC converts the inputted MR signals from parallel signals into a serial signal, and outputs the serial signal to the data transmitting circuit 112. The data transmitting circuit 112 generates MR signals for radio transmission by performing the predetermined processing on the serial signal of the MR signals, and wirelessly transmits the serial signal from the antenna 130a to the antenna 330a.

<4> The data receiving circuit 312 of the control side radio communication device 36A extracts the original digitized MR signals by performing the predetermined processing on the serial signal for radio transmission received by the antenna 330a, and outputs the extracted MR signals to the frequency down conversion circuit 50a. The frequency down conversion circuit 50a performs frequency down conversion on the inputted MR signals, and outputs the MR signals whose frequency is lowered to the raw-data generation circuit 50b. The raw-data generation circuit 50b generates raw data of the MR signals by performing the predetermined processing on the inputted MR signals, and outputs the raw data of the MR signals to the image reconstruction function 62 of the processing circuitry 60. The image reconstruction function 62 converts the raw data of MR signals into k-space data, and stores the k-space data.

By repeating the processing of the above-described sub-steps <1> to <4>, the MR signals detected by the selected coil elements inside the RF coils 100 and 200 are acquired. Afterward, the image reconstruction function 62 reconstructs image data by performing the image reconstruction processing on the k-space data, outputs the reconstructed image data to the image processing function 64 (FIG. 1), and stores the reconstructed image data in the memory circuitry 76.

The image processing function 64 generates display image data of scout images by performing the predetermined image processing on the reconstructed image data, and stores the display image data of the scout images in the memory circuitry 76.

Afterward, the processing proceeds to the Step S6.

[Step S6] The system control function 61 causes the display 74 to three-dimensionally display images indicated by the display image data of the scout images. The above-described "three-dimensionally" means, for example, to display a scout image of an axial cross-section, a scout image of a coronal cross-section, and a scout image of a sagittal cross-section in parallel like FIG. 5.

Afterward, the processing proceeds to the Step S7.

[Step S7] An operator inputs the imaging region of the main scan via the input device 72 by referring to the scout images displayed on the display 74, as mentioned above. The system control function 61 determines the region designated by the operator as the imaging region IMR of the main scan, and outputs information on the determined imaging region IMR to the selection function 66.

Afterward, the processing proceeds to the Step S8.

[Step S8] The selection function 66 determines the appropriate selection number of coil elements based on the three conditions including (a) the imaging region, (b) type of pulse sequence, and (c) the combination of RF coils used in the main scan, as explained with FIG. 5 and FIG. 6.

Next, the selection function 66 calculates the distance DD from the center IMC of the imaging region IMR for each of the coil elements 106a to 106i and 206a to 206f, based on (a) the imaging region IMR of the main scan and (b) the position of each of the coil elements 106a to 106i and 206a to 206f inputted from the position detection function 65, as explained with FIG. 7 and FIG. 8.

Next, the selection function 66 calculates the estimated receiving sensitivity of each of the coil elements 106a to 106i and 206a to 206f, by multiplying the reference receiving sensitivity of each of the coil elements 106a to 106i and 206a to 206f by the sensitivity correction coefficient determined according to the distance DD from the above-described table data. The selection function 66 selects coil elements of the appropriate selection number in order of decreasing estimated receiving sensitivity, out of the coil elements 106a to 106i and 206a to 206f.

Afterward, the processing proceeds to the Step S9.

[Step S9] The selection function 66 causes the display 74 to display information on which coil elements are selected in the Step S9. Specifically, the display 74 may display a schematic arrangement diagram of all the coil elements, each of which is shown by a circle, and may display the circle of each of the selected coil elements by a distinguishable chromatic color as an example.

If an operator agrees with the coil elements automatically selected by the selection function 66, the operator inputs his or her intention of agreeing with the automatically selected coil elements via the input device 72. If an operator disagrees with the coil elements automatically selected by the selection function 66, the operator can manually select coil elements via the input device 72. In this case, input restriction is performed by the selection function 66 and the input device 72, so that the number of coil elements to be selected by an operator does not exceed the appropriate selection number.

After the coil elements used for the main scan is determined by an operator in this manner, the system control function 61 advances the processing to the Step S10.

Note that the present embodiment is not limited to an aspect in which coil elements used for the main scan are finally determined by an operator. The processing of this Step S9 may be omitted. In other words, the coil elements selected by the selection function 66 in the Step S8 may be automatically determined as the coil elements used for the main scan and then the system control function 61 may advance the processing to the next step 10.

[Step S10] The system control function 61 determines all the imaging conditions of the main scan, based on the coil element (s) used for the main scan which is/are selected and finally determined in the Step S9 out of all the coil elements 106a to 106i and 206a to 206f.

In addition, the selection function 66 transmits the information on the coil element(s) used for the main scan to the control circuits 108 and 208 of the respective RF coils 100 and 200, via the radio communication pathway between the antennas 330d and 130d as an example, in a similar manner as mentioned above.

Afterward, the processing proceeds to the Step S11.

[Step S11] The main scan is performed according to the imaging conditions determined up to the Step S10. The operation of acquiring MR signals in the main scan is basically similar to the above-described operation of acquiring MR signals for the scout images, except some differences such as difference in pulse sequences, difference in each imaging region, difference in pixel number, and difference in coil elements used for acquiring MR signals.

After completion of the main scan, the processing proceeds to the Step S12.

[Step S12] The image reconstruction function 62 reconstructs image data by performing the image reconstruction processing on the k-space data of the main scan, outputs the reconstructed image data to the image processing function 64, and stores the reconstructed image data in the memory circuitry 76.

The image processing function 64 generates display image data of the main scan by performing the predetermined image processing on the reconstructed image data of the main scan, and stores the display image data of the main scan in the memory circuitry 76. Afterward, the system control function 61 causes the display 74 to display images indicated by the display image data of the main scan on the display 74.

The foregoing is the explanation of the operation of the MRI apparatus 10A of the first embodiment.

As mentioned above, in the first embodiment, the selection function 66 determines the appropriate selection number of coil elements given by the preliminarily stored table data, depending on the combination of RF coils to be used, type of pulse sequence, and the imaging region (see FIG. 5, FIG. 6, and the Step S8 in FIG. 9). The table data give the appropriate selection number equal to or less than the upper limit number of coil elements, by which the rate of wirelessly transmitting data of MR signals to the side of the control side radio communication device 36A can follow the progression rate of the pulse sequence and/or the image reconstruction processing.

Thus, the problem that too many coil elements are selected and the rate of wirelessly transmitting data of MR signals to the side of the control side radio communication device 36A cannot follow the progression rate of the pulse sequence and/or the image reconstruction processing does not occur.

In addition, the three control side radio communication devices 36A, 36B, and 36C are disposed apart from each other (FIG. 1). Therefore, the position of the RF coil 100 can be accurately determined based on the three response times to the wireless scanning signal between the respective three control side radio communication devices 36A to 36C and the RF coil 100, and the position of the RF coil 200 can be accurately determined in a similar manner (see FIG. 4 and the Steps S3 and S4 of FIG. 9).

Thus, the position detection function 65 can also accurately calculate the position of each of the coil elements 106a to 106i and 206a to 206f, based on (a) the position of each of the RF coils 100 and 200 accurately calculated in the above-described manner, (b) the arrangement direction of each of the RF coils 100 and 200 determined by the posture of the object P, and (c) the arrangement data of the respective coil elements inside each of the RF coils 100 and 200.

Moreover, the selection function 66 can accurately calculate the estimated receiving sensitivity of each of the coil elements 106a to 106i and 206a to 206f, based on (a) the position of each of these coil elements accurately calculated in the above-described manner, (b) the distance DD of each of these coil elements from the imaging region, and (c) each of the sensitivity correction coefficients (see FIG. 8). Then, the selection function 66 selects coil elements of the above-described appropriate selection number in order of decreasing estimated receiving sensitivity, and thus satisfactory image quality is achieved in the main scan. In addition, since the above-described processing of selecting coil elements is automatically performed by the MRI apparatus 10A side, a user does not need to work on complicated operation. As a result, convenience for a user is greatly improved.

Furthermore, in the first embodiment, coil elements are not selected with respect to one direction (e.g., based on positional relationship between the imaging region and the position of each coil element in the Z axis direction as one-directional position) but selected with respect to three axes directions. Specifically, the position of each of the coil elements is calculated with respect to an X-axis direction, a Y-axis direction, and a Z-axis direction of the apparatus coordinate system and then coil elements of the appropriate selection number are selected based on positional relationship between the imaging region and the three-dimensionally determined position of each of the coil elements. As a result, a degree of freedom for selecting coil elements is enhanced, and thus, coil elements close to the imaging region and/or coil elements having higher receiving sensitivity can be more appropriately selected.

Second Embodiment

The second embodiment is similar to the first embodiment except the difference in the method of determining the position of each of the RF coils 100' and 200' and the difference in the method of determining the position of each of the coil elements 106a to 106i and 206a to 206f. Thus, duplicate explanation is omitted, and only the different points between the first and second embodiments will be explained.

Figure 10:
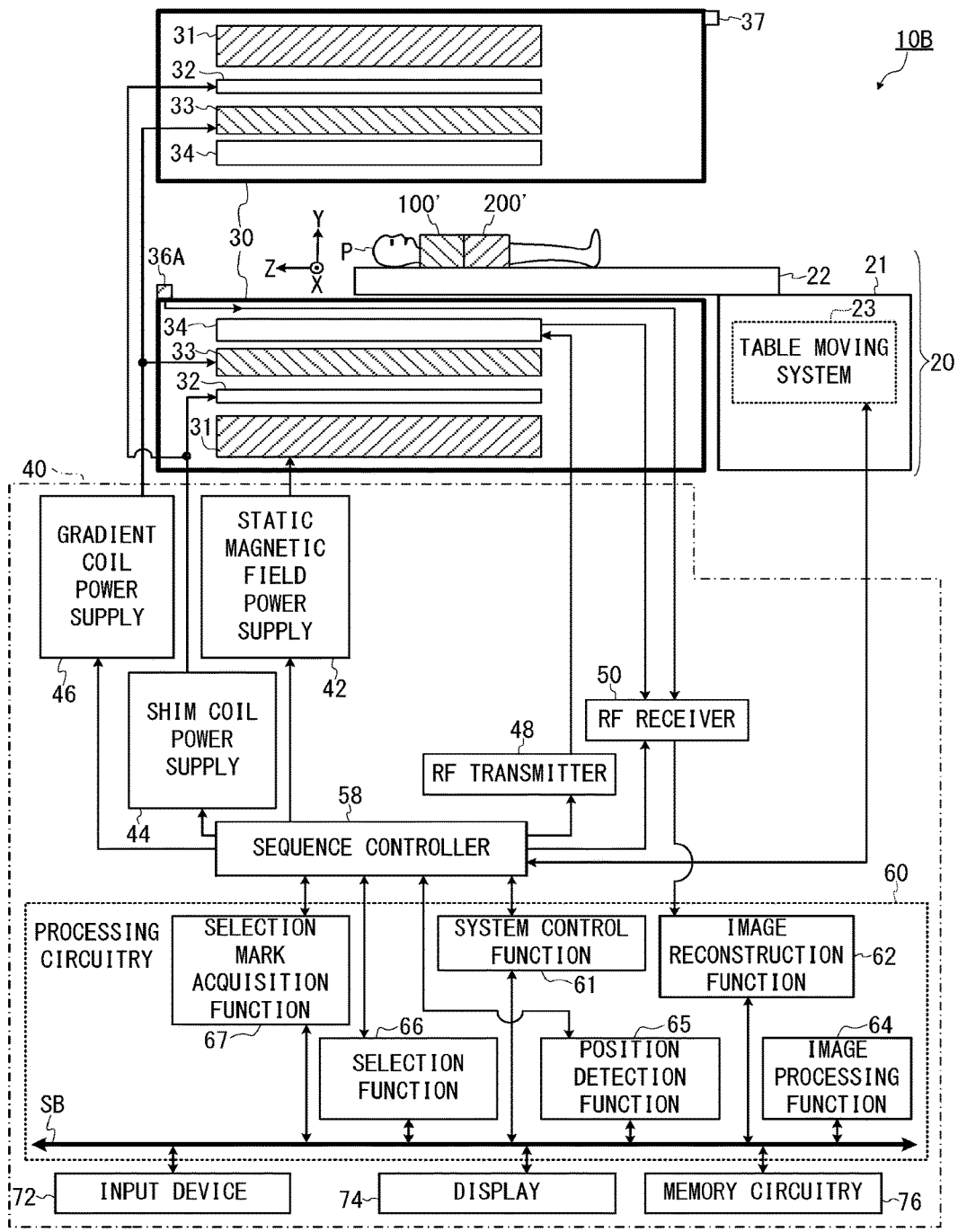
FIG. 10 is a block diagram showing an example of overall configuration of an MRI apparatus of the second embodiment.

FIG. 10 is a block diagram showing an example of overall configuration of the MRI apparatus 10B of the second embodiment. In FIG. 10, the internal configuration of the RF coil 100' and the internal configuration of the RF coil 200' are similar to that of the RF coils 100 and 200 of the first embodiment explained by reference to FIG. 2 and FIG. 3, respectively. The only difference is that multiple identification marks are added on the surface of each of the RF coils 100' and 200' (see FIG. 11).

In addition, the MRI apparatus 10B of the second embodiment includes a selection mark acquisition structure 38 (FIG. 12) which functions in combination with the projector 37 described in the first embodiment, instead of the control side radio communication devices 36B and 36C included in the MRI apparatus 10A of the first embodiment. This selection mark acquisition structure 38 includes a digital camera. The selection mark acquisition structure 38 recognizes the above-described identification marks by the digital camera.

In the second embodiment, the control side radio communication device 36A operates in a manner similar to the first embodiment, except that it does not perform the operation relevant to positional determination of the RF coils 100' and 200'. In other words, the control side radio communication device 36A performs transmission of data indicative of the coil elements selected for the main scan, acquisition of identification signals from the respective RF coils 100' and 200', and reception of data of MR signals.

Figure 11:
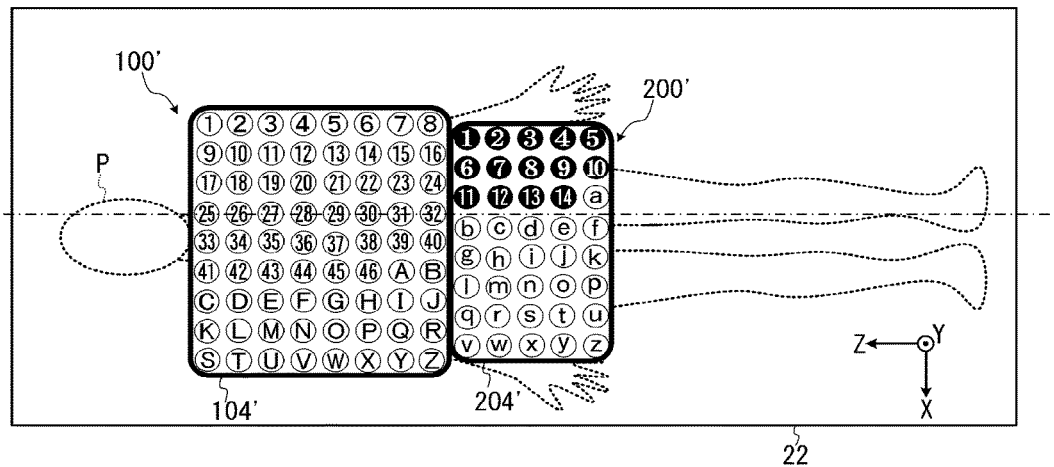
FIG. 11 is a schematic plan diagram showing an example of multiple identification marks added on the surface of each of the cover members of the respective RF coils of the second embodiment.

FIG. 11 is a schematic diagram showing an example of multiple identification marks attached on the RF coils 100' and 200' of the second embodiment. Specifically, multiple identification marks are attached on the surface of each of the cover members 104' and 204' of the RF coils 100' and 200'. As an example here, a total of 72 identification marks including black numerals from 1 to 46 and 26 uppercase alphabetic characters from A to Z are added on the surface of the cover member 104' of the RF coil 100'. In addition, a total of 40 identification marks including 14 numerals from 1 to 14 each of which are drawn as a white character surrounded by a black background and 26 lowercase alphabetic characters from a to z are added on the surface of the cover member 204' of the RF coil 200'.

Incidentally, the identification marks shown in FIG. 11 are only examples. Since it is enough to be able to designate a specified position on the surface of each of the RF coils 100' and 200', pictographs and/or symbols may be used, for example.

In addition, the horizontal chain line in FIG. 11 shows the central line of the width direction of the table 22, i.e., the line of X=0 in the X axis direction. As an example here, the object P is loaded on the slightly rightward region on the table 22 in a face-up position, so that the identification mark (29) on the RF coil 100' is located at the magnetic field center as explained in the next FIG. 12.

Figure 12:
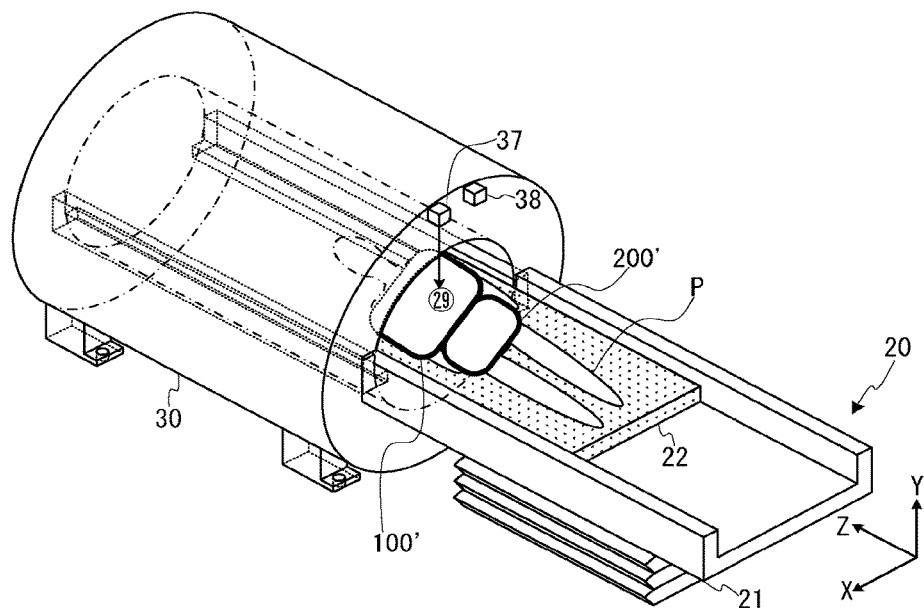
FIG. 12 is a schematic oblique diagram showing an example of structure around the entrance of the gantry of the MRI apparatus of the second embodiment.

FIG. 12 is a schematic oblique diagram showing an example of the structure around the entrance of the gantry 30 of the MRI apparatus 10B of the second embodiment.

The table moving system 23 stores the home position of the predetermined part (for example, the end being opposite to the side of the gantry 30) of the table 22 on the supporting platform 21 and the position of the magnetic field center, by the Z coordinates. In addition, an operator can move the projection position of the projector 37 in the Z axis direction, by operating a non-illustrated button installed on the lateral side of the supporting platform 21 as an example so as to horizontally move the table 22.

Thus, the table moving system 23 horizontally moves the table 22 based on the Z coordinate of the magnetic field center and the Z coordinate of the predetermined part of the table 22 when the projection position of the projector 37 is finally fixed, so that the finally fixed projection position is located at the magnetic field center.

In the example of FIG. 12, the part of the identification mark (29) on the RF coil 100' is finally fixed to the projection position of the projector 37. In this case, the selection mark acquisition structure 38 images the projection position of the projector 37 by the digital camera and determines the identification mark at the projection position by performing pattern matching analysis on the obtained image data. The selection mark acquisition structure 38 outputs the information on the identification mark at the projection position of the projector 37 to the position detection function 65 of the processing circuitry 60 via non-illustrated hardwiring.

For simplifying the explanation, it is assumed that the table 22 does not move in its width direction (i.e., the X axis direction). Thus, an operator can locate the target part of imaging at the center line in the width direction of the table 22 (i.e., on the chain line in FIG. 11), by slightly moving the object P on the table 22 rightward or leftward.

The position detection function 65 stores data of the color, pattern, and arrangement of all the identification marks on each of the RF coils (such as 100' and 200'), for each identification information of each of the RF coils. The position detection function 65 calculates the central position of the RF coil 100' and the position of each of the coil elements 106a to 106i, based on the following three sets of information.

Firstly, the position detection function 65 uses the information on the identification mark inputted from the selection mark acquisition structure 38 and can determine that the identification mark (29) of the RF coil 100' is located at the magnetic field center in this example. Secondly, the position detection function 65 uses the information on the arrangement direction of the RF coil 100' determined from the posture of the object P as one of imaging conditions. Thirdly, the position detection function 65 uses the arrangement data of the coil elements 106a to 106i inside the RF coil 100' as mentioned in the first embodiment.

As an example here, the position detection function 65 recognizes existence of the RF coil 200' aside from the RF coil 100' having been already recognized by the identification mark, based on each identification information wirelessly transmitted from each of the RF coils 100' and 200'.

In addition, the position detection function 65 preliminarily stores table data, which give positional relationship between RF coils in the case of using plural RF coils, since the time of installation of the MRI apparatus 10B. These table data give information on how much central positions of the respective RF coils are separated from each other in the respective X axis, Y axis, and Z axis directions, based on (a)

the combination of plural RF coils, (b) the posture of the object P on the table 22, and (c) the height of the object P. Such table data can be obtained before installation of the MRI apparatus 10B by experiments and/or simulation.

Afterward, the position detection function 65 calculates the central position of the RF coil 200' based on the central position of the RF coil 100' and the above-described table data, and then calculates the position of each of the coil elements 206a to 206f inside the RF coil 200' in a manner similar to the first embodiment.

The essential point of the positional determination in the second embodiment lies in that position identification information indicating which part of the RF coil is arranged at a specified position such as the magnetic field center is obtained. Thus, for example, the MRI apparatus 10B may be configured so that this position identification information is manually inputted and the selection mark acquisition structure 38 is omitted. In this case, an operator can input (a) identification information of the RF coil and (b) information on the selected identification mark of this RF coil which the operator hopes to locate at the magnetic field center, via the input device 72 as an example.

Figure 13:
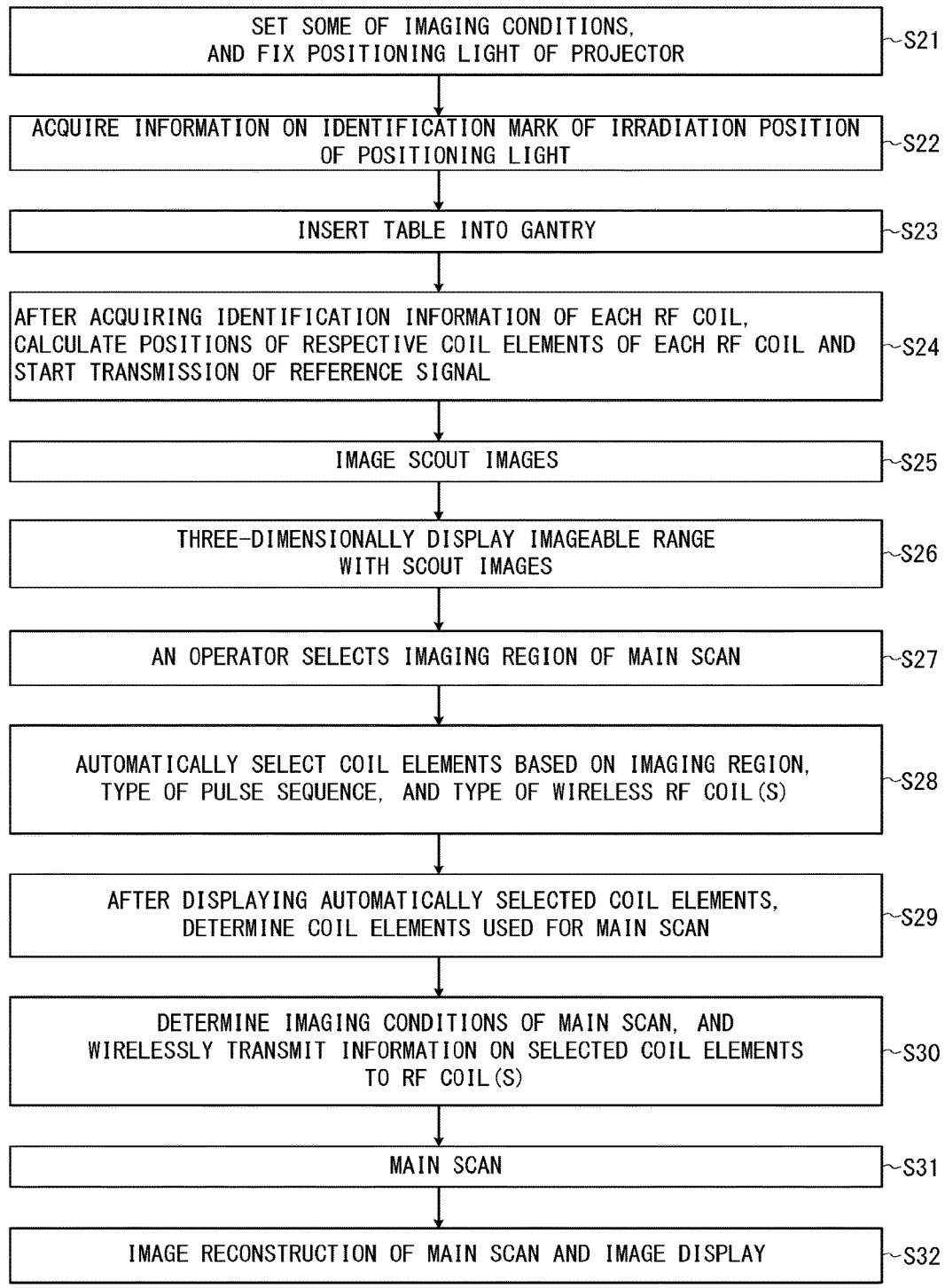
FIG. 13 is a flowchart showing an example of a flow of an operation performed by the MRI apparatus of the second embodiment.

FIG. 13 is a flowchart illustrating an example of a flow of an operation performed by the MRI apparatus 10B of the second embodiment. In the following, according to the step numbers in the flowchart shown in FIG. 13, an operation performed by the MRI apparatus 10B will be described by reference to the aforementioned FIG. 1 to FIG. 12 as required.

[Step S21] The system control function 61 of the processing circuitry 60 (FIG. 10) sets some of the imaging conditions of the main scan such as the height of the object P and the posture of the object P on the table 22, based on imaging conditions inputted via the input device 72 in a manner similar to the Step S1 of FIG. 9 in the first embodiment. In addition, the RF coils 100' and 200' are attached to the object P when the table 22 is at the home position on the supporting platform 21. Afterward, an operator operates the input device 72 so as to horizontally move the table 22 (or directly moves the object P on the table 22 rightward or leftward), so that the projection position of positioning light of the projector 37 is fixed at the position on the object P which the operator hopes to locate at the magnetic field center.

Afterward, the processing proceeds to the Step S22.

[Step S22] After fixing the projection position of positioning light, the selection mark acquisition structure 38 determines the identification mark at the projection position by analyzing the image data obtained by imaging the projection position as mentioned above, and outputs the information on the identification mark at the projection position to the position detection function 65. The position detection function 65 determines which RF coil is located at the magnetic field center, based on the information on the identification mark. Although the operation will be explained on the assumption that the RF coil 100' is located at the magnetic field center as an example in FIG. 13, the operation in the case of locating the RF coil 200' at the magnetic field center is similar to the operation in FIG. 13 described below.

Afterward, the processing proceeds to the Step S23.

[Step S23] The table moving system 23 horizontally moves the table 22, so that the finally fixed projection position is located at the magnetic field center as mentioned above.

Afterward, the processing proceeds to the Step S24.

[Step S24] When the position of the table 22 is once fixed, the position detection function 65 outputs an instruction to obtain identification signals of the respective RF coils 100' and 200' to the positional signal transmitting/receiving circuit 324 (FIG. 4) of the control side radio communication device 36A, responding to the fixation of the position of the table 22.

Afterward, the positional signal response circuit 124 of each of the RF coils 100' and 200' wirelessly transmits the identification information from the antenna 130d to the antenna 330d of the control side radio communication device 36A, and the positional signal transmitting/receiving circuit 324 outputs each identification information received by the antenna 330d to the position detection function 65. Thereby, the position detection function 65 recognizes the existence of the RF coil 200' as an RF coil which is not recognized by the identification mark. Furthermore, the position detection function 65 acquires the posture of the object P on the table 22 and the height of the object P from the system control function 61.

Next, the position detection function 65 calculates and stores the central position of the RF coil 100' and the position of each of the coil elements 106a to 106i, based on the information on (a) the identification mark acquired in the Step S22, (b) the arrangement direction of the RF coil 100' determined from the posture of the object P, and (c) the arrangement data of the respective coil elements 106a to 106i inside the RF coil 100'.

Next, the position detection function 65 calculates the central position of the RF coil 200' by using the following conditions. Firstly, the table data, which give positional relationship between RF coils in the case of using plural RF coils, are used. Secondly, information on the combination of the RF coils is used. In this example, it is the information that two RF coil 100' and 200' are used. Thirdly, the arrangement direction of the RF coil 200' determined from the posture of the object P is used. Fourthly, the height of the object P is used.

Next, the position detection function 65 calculates and stores the position of each of the coil elements 206a to 206f inside the RF coil 200' based on the central position of the RF coil 200', in a manner similar to the first embodiment.

Afterward, the processing proceeds to the Step S25.

[Steps S25 to S32] The processing in each of the Steps S25 to S32 is the same as the processing in each of the Steps S5 to S12 in FIG. 9 of the first embodiment, and duplicate explanation is omitted.

The foregoing is the explanation of the configuration and operation of the second embodiment.

Although duplicate explanation is omitted, the selection function 66 in the second embodiment similarly determines the appropriate selection number of coil elements given by the table data according to the combination of the RF coils to be used, the type of pulse sequence, and the imaging region (see the Step S28 of FIG. 13). These table data gives the appropriate selection number equal to or less than the upper limit number of coil elements, by which the rate of wirelessly transmitting data of MR signals can follow the progression rate of the pulse sequence and/or the image reconstruction processing. Thus, in the second embodiment, the same effects as the first embodiment can be obtained.

Furthermore, in the second embodiment, coil elements are also selected with respect to three directions based on positional relationship between the imaging region and the position of each of the coil elements defined by three axial directions, in a manner similar to the first embodiment. As a result, a degree of freedom for selecting coil elements is enhanced, and thus, coil elements close to the imaging region and/or coil elements having higher receiving sensitivity can be more appropriately selected.

According to each of the above-described embodiments, technology to cause the rate of wirelessly transmitting data of MR signals from a wireless RF coil to an RF receiver side of an MRI apparatus to follow progression rate of a pulse sequence and/or progression rate of image reconstruction processing is achieved.

<Supplementary Notes on Each Embodiment>

[1] In the first embodiment, an example in which the distances DA-100, DB-100 and DC-100 between the antenna 130d of the RF coil 100 and the respective control side radio communication devices 36A, 36B, and 36C based on each response time from transmission timing of the scanning signal to the reception timing of the response signal has been explained. However, embodiments of the present invention are not limited to such an aspect.

For example, the distances DA-100, DB-100, DC-100 between the antenna 130d of the RF coil 100 and the respective control side radio communication devices 36A, 36B, and 36C may be calculated based on degree of attenuation of the respective three response signals to the scanning signal.

In this case, the control side radio communication device 36A (FIG. 4) wirelessly transmits the scanning signal having predetermined electromagnetic wave intensity from the antenna 330d, and the positional signal response circuit 124 of the RF coil 100 measures intensity of the scanning signal received by the antenna 130d. At the timing when the first delay time unique to the RF coil 100 elapses from the reception time of this scanning signal, the positional signal response circuit 124 of the RF coil 100 radiates the response signal from the antenna 130d in response to the scanning signal, in the following manner. That is, the response signal is radiated so that the response signal includes the identification information of the RF coil 100, has the same frequency as the scanning signal, and has the same intensity as the measured intensity of the scanning signal.

The positional signal response circuit 124 of the RF coil 200 operates in a manner similar to that of the RF coil 100 in response to the scanning signal from the control side radio communication device 36A, except that the delay time and the identification information are unique to the RF coil 200.

Since the first delay time is different from the second delay time, the positional signal transmitting/receiving circuit 324 of the control side radio communication device 36A receives the two response signals from the respective RF coils 100 and 200 in a time-division manner, and measures intensity of the respective response signals. Afterward, the positional signal transmitting/receiving circuit 324 acquires the identification information by analyzing each of the response signals and determines which RF coil is the transmission source of each of the response signals.

Next, the positional signal transmitting/receiving circuit 324 outputs reception intensity (attenuation ratio) of the response signal from the RF coil 100 calculated under the premise that the intensity of the scanning signal before attenuation is 100% as an example, to the position detection function 65. In a similar manner, the positional signal transmitting/receiving circuit 324 outputs reception intensity of the response signal from the RF coil 200 to the position detection function 65.

The position detection function 65 calculates the distance between the antenna 330d of the control side radio communication device 36A and the antenna 130d of the RF coils 100, based on the inputted information. In a similar manner, the position detection function 65 calculates the distance between the antenna 330d and the antenna 130d of the RF coils 200.

Next, the position detection function 65 instructs the control side radio communication device 36B to perform the similar operation, and calculates the distance between the antenna 330d of the control side radio communication device 36B and the antenna 130d of each of the RF coils 100 and 200. Further, the position detection function 65 instructs the control side radio communication device 36C to perform the similar operation, and calculates the distance between the antenna 330d of the control side radio communication device 36C and the antenna 130d of each of the RF coils 100 and 200.

As mentioned above, in the case of determining the distance based on reception intensity (attenuation ratio) of the response signal with respect to transmission intensity of the scanning signal, it is preferable that the frequencies of the response signals of the respective RF coils 100 and 200 are unified. This is because energy of an electromagnetic wave more rapidly attenuates as its frequency becomes higher and attenuation ratio is different depending on frequency.

[2] In the first embodiment, an example, in which the positional signal transmitting/receiving circuit 324 performs transmission of the scanning signal and reception of the response signals by using the antenna 330d and the positional signal response circuit 124 performs reception of the scanning signal and transmission of the response signal by using the antenna 130d, has been explained by reference to FIG. 4. However, embodiments of the present invention are not limited to such an aspect.

Transmission of the scanning signal and reception of the response signals may be performed by separate antennas by increasing the number of antennas in the control side radio communication device 36A. As to the RF coil 100, reception of the scanning signal and transmission of the response signal may be performed by separate antennas by increasing the number of antennas.

Figure 14:
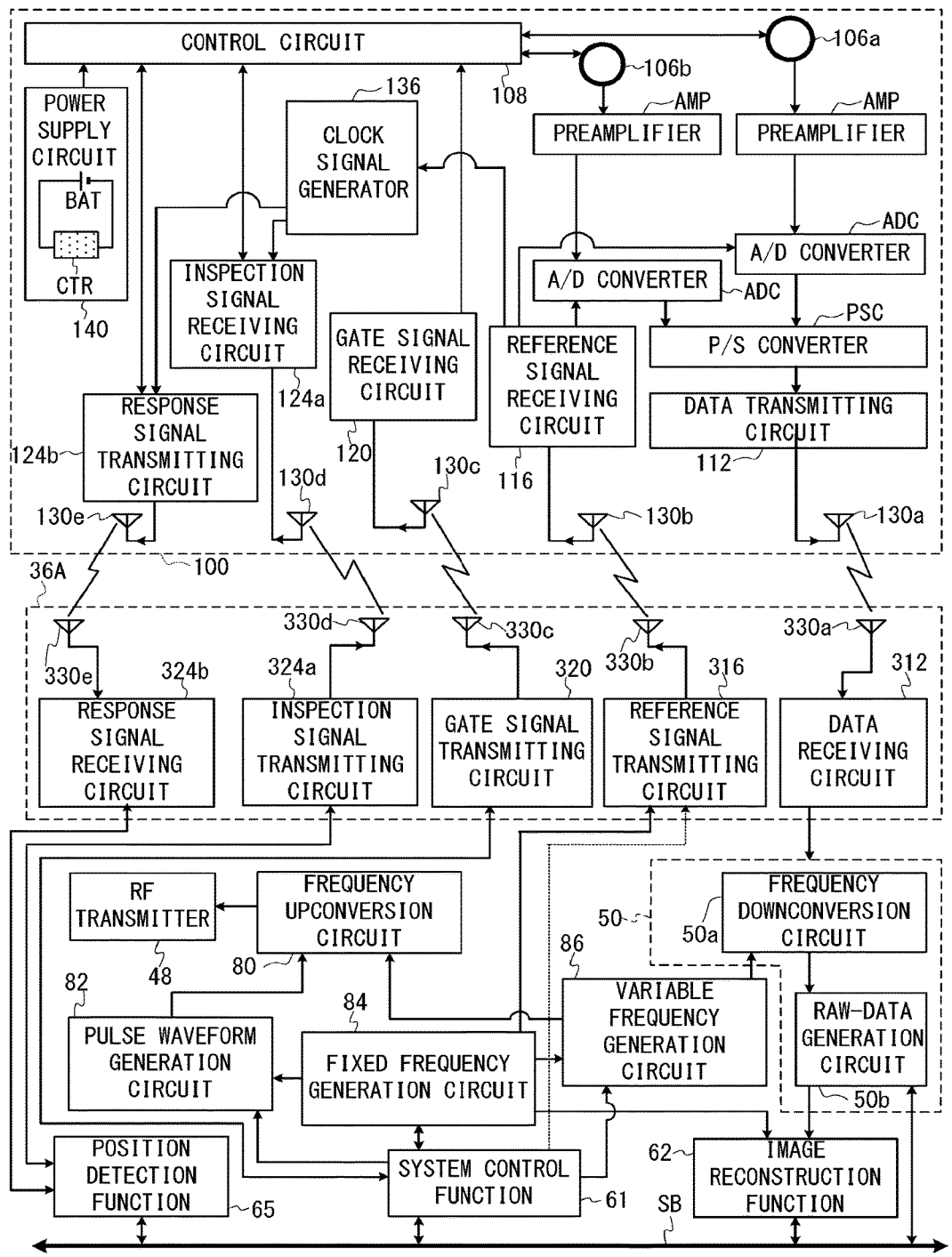
FIG. 14 a schematic functional block diagram showing a digital radio communication system in which transmission of the scanning signals and reception of the response signals are performed by separate antennas as a modification of the first embodiment.

FIG. 14 is a schematic functional block diagram showing a digital radio communication system in which transmission of the scanning signals and reception of the response signals are performed by separate antennas as a modification of the first embodiment.

In the control side radio communication device 36A shown in FIG. 14, the scanning signal transmitting circuit 324a wirelessly transmits the scanning signal by using the antenna 330d in a similar manner as described above, and the response signal receiving circuit 324b receives the response signals by using the antenna 330e in a similar manner as described above. Further, the response signal receiving circuit 324b outputs the identification information and the distance information (response time) obtained from received signals to the position detection function 65.

In the RF coil 100 shown in FIG. 14, the scanning signal receiving circuit 124a receives the scanning signal by using the antenna 130d in a similar manner as described above, and the response signal transmitting circuit 124b wirelessly transmits the response signal by using the antenna 130e in a similar manner as described above. The other configuration of the modification shown in FIG. 14 is similar to that of the first embodiment explained by reference to FIG. 4.

[3] In the first and second embodiments, an example in which the wireless RF coil 100 or 100' for the chest part and the wireless RF coil 200 or 200' for the pelvic part are used has been explained. However, embodiments of the present invention are not limited to such an aspect. The MRI apparatuses 10A and 10B can use various types of mountable RF coils such as an RF coil for the shoulder and an RF coil for the knee, in addition to the above RF coils 100, 100', 200, and 200'.

In addition, each of the MRI apparatuses 10A and 10B includes non-illustrated connection ports on the table 22, and can use wired type RF coils as well as wireless RF coils. The above-described wired type RF coil means an RF coil which is attached to the object P, connected to one of the connection ports via its cable, and transmits data of received MR signals by wire via the connected connection port. Such a wired type RF coil may also be interpreted as one of the components of each of the MRI apparatuses 10A and 10B or may be interpreted as a separate component independent of each of the MRI apparatuses 10A and 10B.

[4] When the imaging region is close to a cube, there is no problem in configuration of calculating the estimated receiving sensitivity of each of the coil elements based on the distance DD from the center IMC of the imaging region IMR as explained with FIG. 7 and FIG. 8. By contrast, consider a rectangular parallelopiped imaging region in which the difference between its longest side and its shortest side is large. In this case, the selection function 66 may calculate an region in the form of an ellipsoidal body by enlarging the above-described longest side by a fixed magnification ratio and enlarging above-described shortest side by the same fixed magnification ratio. Then, the selection function 66 may gradually enlarge this ellipsoidal body by maintaining the same shape, until coil elements of the appropriate selection number included in the enlarged ellipsoidal body region can be selected.

Although the selection function 66 calculates the estimated receiving sensitivity based on the sensitivity correction coefficients and the distance DD from the center IMC of the imaging region IMR in the first and second embodiments, this is only an example. When the table 22 is located at such a position that the center of an imaging region is substantially at the magnetic field center as an example, the selection function 66 may calculate the estimated receiving sensitivity based on the sensitivity correction coefficients and the distance from the magnetic field center and similarly select coil elements of the appropriate selection number in order of decreasing estimated receiving sensitivity.

In the first and second embodiments, calculation of the estimated receiving sensitivity using the sensitivity correction coefficients may be omitted. In other words, in the first and second embodiments, the selection function 66 may select coil elements of the appropriate selection number in order of increasing distance DD from the center of the imaging region. When the center of the imaging region is substantially located at the magnetic field center, the selection function 66 may select coil elements of the appropriate selection number in order of increasing distance from the magnetic field center.

[5] An example, in which the selection function 66 of the processing circuitry 60 preliminarily stores the arrangement data of each of the coil elements 106a to 106i in each of the RF coils 100 and 100' and the coil elements 206a to 206f in each of the RF coils 200 and 200' for each identification information, has been explained in each of the above-described embodiments. However, embodiments of the present invention are not limited to such an aspect.

The MRI apparatuses 10A and 10B may be configured to obtain the arrangement data of the respective coil elements by wireless communication, without storing the arrangement data of the coil elements of each of the RF coils in the selection function 66 for each identification information. Since the MRI apparatus 10A and 10B of the first and second embodiments are configured so that each of the RF coils 100, 100', 200, and 200' wirelessly transmits its identification information to the control side radio communication device 36A, the arrangement data of the coil elements in each of the RF coils 100, 100', 200, and 200' may be included in each identification information as an example.

According to at least one of the above-mentioned embodiments, coil elements to be actually used in imaging can be appropriately selected out of plural coil elements included in a wireless RF coil attached to an object.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
   a wireless radio frequency (RF) coil equipped with a plurality of coil elements;
   a memory storing at least one program; and
   processing circuitry configured to, by executing the at least one program,
      set an imaging region of an object,
      identify a position of each of the plurality of coil elements included in the wireless RF coil, based on a signal obtained by radio communication with the wireless RF coil, and
      select at least one coil element out of the plurality of coil elements, based on receiving a sensitivity of each of the plurality of coil elements, which is estimated based on a distance between the imaging region and the identified position of each of the plurality of coil elements.

2. The magnetic resonance imaging apparatus according to claim 1, further comprising a plurality of radio communication circuits positioned apart from each other,
   wherein each of the plurality of radio communication circuits is configured to wirelessly transmit a scanning signal to the wireless RF coil and wirelessly receive a response signal in response to the scanning signal, from the wireless RF coil; and
   the processing circuitry is further configured to identify the position of each of the plurality of coil elements, based on the response signal received by each of the plurality of radio communication circuits.

3. The magnetic resonance imaging apparatus according to claim 1,
   wherein the processing circuitry is further configured to select at least one coil element out of the plurality of coil elements, based on receiving the sensitivity of each of the plurality of coil elements, which is estimated based on (a) a size of each of the plurality of coil elements, and (b) the distance between the imaging region and each of the plurality of coil elements.

4. A magnetic resonance imaging apparatus, comprising:
   a wireless radio frequency (RF) coil equipped with a plurality of coil elements;
   a memory storing at least one program; and processing circuitry configured to, by executing the at least one program,
set an imaging region of an object,
identify a position of each of the plurality of coil elements included in the wireless RF coil, based on a signal obtained by radio communication with the wireless RF coil,
preliminarily determine a number of coil elements to be selected out of the plurality of coil elements, based on an imaging condition, and
select the preliminarily determined number of coil elements out of the plurality of coil elements, in order of increasing distance from the imaging region.

5. The magnetic resonance imaging apparatus according to claim 4, wherein the imaging condition is a combination of RF coils.

6. The magnetic resonance imaging apparatus according to claim 4, wherein the imaging condition is a type of pulse sequence.

7. The magnetic resonance imaging apparatus according to claim 4, wherein the imaging condition is an imaging part.

* * * * *